(12) United States Patent
Wei et al.

(10) Patent No.: US 11,943,981 B2
(45) Date of Patent: Mar. 26, 2024

(54) DISPLAY SUBSTRATE AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Bo Wei, Beijing (CN); Hongjun Zhou, Beijing (CN); Lili Du, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/801,568

(22) PCT Filed: Oct. 12, 2021

(86) PCT No.: PCT/CN2021/123171
§ 371 (c)(1),
(2) Date: Aug. 23, 2022

(87) PCT Pub. No.: WO2022/095665
PCT Pub. Date: May 12, 2022

(65) Prior Publication Data
US 2023/0136237 A1 May 4, 2023

(30) Foreign Application Priority Data
Nov. 9, 2020 (CN) .......................... 202011243173.8

(51) Int. Cl.
*H10K 59/131* (2023.01)
*G09G 3/3233* (2016.01)
*G09G 3/3266* (2016.01)

(52) U.S. Cl.
CPC ......... *H10K 59/131* (2023.02); *G09G 3/3233* (2013.01); *G09G 3/3266* (2013.01);
(Continued)

(58) Field of Classification Search
CPC ............. H10K 59/131; H10K 59/1216; G09G 3/3233; G09G 3/3266; G09G 2300/0426;
(Continued)

(56) References Cited

U.S. PATENT DOCUMENTS 10,797,089 B2 * 10/2020 Song ..................... H01L 27/124
10,985,191 B2    4/2021 Ning
(Continued)

FOREIGN PATENT DOCUMENTS

CN         108231790 A        6/2018
CN         108376522 A        8/2018
(Continued)

*Primary Examiner* — David D Davis
(74) *Attorney, Agent, or Firm* — Westman, Champlin & Koehler, P.A.

(57) ABSTRACT

A display substrate and display apparatus are provided. The display substrate includes: a base substrate, including a display area and a bezel area; a plurality of pixel units located in the display area and arranged in an array along a row direction and a column direction on the base substrate; a plurality of scanning signal lines; a gate driver circuit located in the bezel area; a plurality of load compensation units located in the bezel area, the plurality of load compensation units are located between the gate driver circuit and the plurality of pixel units; and a plurality of scanning signal lead wires located in the bezel area and configured to transmit a scanning signal output by the gate driver circuit to the scanning signal lines, where at least one of the scanning signal lead wires crosses at least one of the load compensation units in the row direction.

19 Claims, 15 Drawing Sheets

(52) U.S. Cl.
CPC .............. *G09G 2300/0426* (2013.01); *G09G 2300/0819* (2013.01); *G09G 2300/0852* (2013.01); *G09G 2310/0297* (2013.01); *G09G 2330/12* (2013.01)

(58) Field of Classification Search
CPC ... G09G 2300/0819; G09G 2300/0852; G09G 2310/0297; G09G 2330/12; G09G 2300/0842; G09G 2300/0861; G09G 2320/0223; G09G 2320/0233
See application file for complete search history.

(56) References Cited

U.S. PATENT DOCUMENTS

| | | | |
|---|---|---|---|
| 10,997,905 | B2 | 5/2021 | Tong et al. |
| 11,037,960 | B2 | 6/2021 | Hong et al. |
| 2019/0107761 | A1 | 4/2019 | Yasuda |
| 2019/0131360 | A1 | 5/2019 | Lee et al. |
| 2019/0148465 | A1 | 5/2019 | Yu et al. |
| 2019/0181213 | A1 | 6/2019 | Lim |
| 2019/0326334 | A1* | 10/2019 | Song ................... H01L 27/1255 |
| 2020/0212070 | A1 | 7/2020 | Hong et al. |
| 2020/0328231 | A1 | 10/2020 | Ning |
| 2021/0027704 | A1 | 1/2021 | Tong et al. |

FOREIGN PATENT DOCUMENTS

| | | |
|---|---|---|
| CN | 108598127 A | 9/2018 |
| CN | 108648615 A | 10/2018 |
| CN | 108807488 A | 11/2018 |
| CN | 108878452 A | 11/2018 |
| CN | 109065550 A | 12/2018 |
| CN | 109765738 A | 5/2019 |
| CN | 110164869 A | 8/2019 |
| CN | 209843713 U | 12/2019 |
| CN | 110782833 A | 2/2020 |
| CN | 211426992 U | 9/2020 |
| CN | 214505498 U | 10/2021 |
| KR | 20090005651 A | 1/2009 |

* cited by examiner

DISPLAY SUBSTRATE AND DISPLAY APPARATUS

CROSS-REFERENCE TO RELATED APPLICATION

This application is a Section 371 National Stage Application of International Application No. PCT/CN2021/123171, filed on Oct. 12, 2021, entitled "DISPLAY SUBSTRATE AND DISPLAY APPARATUS", which published as WIPO Publication No. WO 2022/095665 A1, on May 12, 2022, not in English, which claims priority to Chinese Patent Application No. 202011243173.8, filed on Nov. 9, 2020, the disclosures of which are incorporated herein by reference in their entireties.

TECHNICAL FIELD

The present disclosure relates to a field of a display technology, in particular to a display substrate and a display apparatus.

BACKGROUND

At present, organic light emitting diode (OLED) display panels are widely used in smart phones, televisions, virtual reality devices, wearable products and other fields due to their excellent display effect, light weight, flexibility, excellent shock resistance and adaptability to wearable products. With a development of display panel technology and higher and higher requirements of the market for a screen ratio and adaptability of display panels, a narrow bezel design or even no bezel design and various special shape designs of display apparatus have gradually become challenges for developers in the field of OLED display technology.

The above information disclosed in this section is only for the understanding of the background of a technical concept of the present disclosure. Therefore, the above information may contain information that does not constitute a related art.

SUMMARY

In an aspect, a display substrate is provided, including:
a base substrate, including a display area and a bezel area located on at least one side of the display area;
a plurality of pixel units located in the display area and arranged in an array along a row direction and a column direction on the base substrate, where each pixel unit includes a plurality of sub-pixels;
a plurality of scanning signal lines disposed on the base substrate, where the plurality of scanning signal lines are configured to provide a scanning signal to a plurality of rows of sub-pixels respectively;
a gate driver circuit disposed on the base substrate and located in the bezel area, where the gate driver circuit is configured to output the scanning signal;
a plurality of load compensation units disposed on the base substrate and located in the bezel area, where the plurality of load compensation units are located between the gate driver circuit and the plurality of pixel units; and
a plurality of scanning signal lead wires disposed on the base substrate and located in the bezel area, where the plurality of scanning signal lead wires are configured to transmit the scanning signal output by the gate driver circuit to the plurality of scanning signal lines respectively, where
at least one of the plurality of scanning signal lead wires crosses at least one of the plurality of load compensation units in the row direction.

According to some exemplary embodiments, the load compensation unit includes a plurality of compensation capacitors, where each compensation capacitor includes a first compensation capacitor electrode located in a first conductive layer and a second compensation capacitor electrode located in a second conductive layer, and an orthographic projection of the first compensation capacitor electrode on the base substrate at least partially overlaps with an orthographic projection of the second compensation capacitor electrode on the base substrate, where the plurality of scanning signal lead wires are located in a third conductive layer, the second conductive layer is located on a side of the first conductive layer away from the base substrate, and the third conductive layer is located on a side of the second conductive layer away from the base substrate; and where an orthographic projection of at least one of the plurality of scanning signal lead wires on the base substrate partially overlaps with an orthographic projection of at least one of the plurality of load compensation units on the base substrate.

According to some exemplary embodiments, an orthographic projection of at least one of the plurality of scanning signal lead wires on the base substrate at least partially overlaps with orthographic projections of first compensation capacitor electrodes of a plurality of compensation capacitors of at least one of the plurality of load compensation units on the base substrate and with orthographic projections of second compensation capacitor electrodes of the plurality of compensation capacitors of the at least one of the plurality of load compensation units on the base substrate.

According to some exemplary embodiments, within one of the load compensation units, first compensation capacitor electrodes of the plurality of compensation capacitors are arranged at intervals in the row direction, so as to form a gap between the plurality of first compensation capacitor electrodes; and at least one of the plurality of scanning signal lead wires includes a first portion, and an orthographic projection of the first portion of the scanning signal lead wire on the base substrate partially overlaps with an orthographic projection of the gap on the base substrate.

According to some exemplary embodiments, the first portion of the scanning signal lead wire extends in a direction inclined with respect to each of the row direction and the column direction.

According to some exemplary embodiments, the display substrate further includes a plurality of data signal lines disposed on the base substrate and configured to provide a data signal to a plurality of columns of sub-pixels, respectively, where each first compensation capacitor electrode is electrically connected to one of the plurality of data signal lines through at least two first via holes, where the at least two first via holes are arranged at intervals in the row direction.

According to some exemplary embodiments, an orthographic projection of one first compensation capacitor electrode on the base substrate has a first size in the column direction; and one load compensation unit partially overlap with another load compensation unit adjacent to the load compensation unit in the column direction, where a size of an overlapping part between two adjacent load compensation units in the column direction is less than or equal to half of the first size.

According to some exemplary embodiments, one load compensation unit and another load compensation unit adjacent to the load compensation unit are spaced apart in the column direction.

According to some exemplary embodiments, the display substrate further includes: a plurality of initialization voltage lines disposed on the base substrate, where the plurality of initialization voltage lines are configured to provide an initialization voltage signal to the plurality of rows of sub-pixels, respectively; and a plurality of initialization voltage lead wires disposed on the base substrate and located in the bezel area, where the plurality of initialization voltage lead wires are configured to transmit the initialization voltage signal to the plurality of initialization voltage lines, where at least one of the plurality of initialization voltage lead wires crosses at least one of the plurality of load compensation units in the row direction.

According to some exemplary embodiments, at least one of the plurality of initialization voltage lead wires includes a first portion, and an orthographic projection of the first portion of the initialization voltage lead wire on the base substrate partially overlaps with the orthographic projection of the gap on the base substrate.

According to some exemplary embodiments, the first portion of the initialization voltage lead wire extends in a direction inclined with respect to each of the row direction and the column direction.

According to some exemplary embodiments, the display substrate further includes a plurality of driving voltage lines disposed on the base substrate, and configured to provide a driving voltage signal to the plurality of columns of sub-pixels respectively, where each second compensation capacitor electrode is electrically connected to one of the plurality of driving voltage lines through at least two second via holes, where the at least two second via holes are arranged at intervals in the column direction.

According to some exemplary embodiments, the display substrate further includes a test circuit disposed on the base substrate and located in the bezel area, where the test circuit is configured to output a data signal; and where each first compensation capacitor electrode is electrically connected to the test circuit through at least two third via holes.

According to some exemplary embodiments, the display substrate further includes a driving voltage lead wire disposed on the base substrate and located in the bezel area, where the driving voltage lead wire is configured to transmit the driving voltage signal; and where each second compensation capacitor electrode is electrically connected to the driving voltage lead wire through at least two fourth via holes.

According to some exemplary embodiments, the load compensation unit includes at least three compensation capacitors, and within one load compensation unit, first compensation capacitor electrodes of the at least three compensation capacitors are arranged at intervals in the row direction, so as to form a first gap and a second gap between the at least three first compensation capacitor electrodes; and where the at least one of the plurality of scanning signal lead wires includes a first portion and a second portion, where an orthographic projection of the first portion of the scanning signal lead wire on the base substrate partially overlaps with an orthographic projection of the first gap on the base substrate, and an orthographic projection of the second portion on the base substrate partially overlaps with an orthographic projection of the second gap on the base substrate.

According to some exemplary embodiments, at least one of the first portion and the second portion of the scanning signal lead wire extends in a direction inclined with respect to each of the row direction and the column direction.

According to some exemplary embodiments, at least one of the plurality of initialization voltage lead wires includes a first portion and a second portion, an orthographic projection of the first portion of the initialization voltage lead wire on the base substrate partially overlaps with the orthographic projection of the first gap on the base substrate, and an orthographic projection of the second portion of the initialization voltage lead wire on the base substrate partially overlaps with the orthographic projection of the second gap on the base substrate.

According to some exemplary embodiments, at least one of the first portion and the second portion of the initialization voltage lead wire extends in a direction inclined with respect to each of the row direction and the column direction.

According to some exemplary embodiments, within one load compensation unit, second compensation capacitor electrodes of the plurality of compensation capacitors are connected to each other.

According to some exemplary embodiments, within one load compensation unit, orthographic projections of first compensation capacitor electrodes of the plurality of compensation capacitors on the base substrate falls within an orthographic projection of the plurality of second compensation capacitor electrodes that are connected to each other on the base substrate.

According to some exemplary embodiments, the orthographic projection of the plurality of second compensation capacitor electrodes that are connected to each other on the base substrate covers each of the orthographic projection of the first gap on the base substrate and the orthographic projection of the second gap on the base substrate.

According to some exemplary embodiments, the orthographic projection of the plurality of second compensation capacitor electrodes that are connected to each other on the base substrate covers each of the orthographic projection of the first portion of the scanning signal lead wire on the base substrate and the orthographic projection of the second portion of the scanning signal lead wire on the base substrate; and where the orthographic projection of the plurality of second compensation capacitor electrodes that are connected to each other on the base substrate covers each of the orthographic projection of the first portion of the initialization voltage lead wire on the base substrate and the orthographic projection of the second portion of the initialization voltage lead wire on the base substrate.

According to some exemplary embodiments, each of a size of the first gap in the row direction and a size of the second gap in the row direction is in a range from 1 microns to 6 microns.

According to some exemplary embodiments, the plurality of scanning signal lines are located in the first conductive layer; and/or the plurality of initialization voltage lines are located in the second conductive layer.

According to some exemplary embodiments, an orthographic projection of the display area on the base substrate has a shape of a rounded rectangle.

According to some exemplary embodiments, the plurality of load compensation units are arranged along an outline of a rounded corner of the rounded rectangle.

According to some exemplary embodiments, the plurality of load compensation units correspond to a plurality of columns of pixel units one by one, and an area of an overlapping region between the first compensation capacitor electrode and the second compensation capacitor electrode in each load compensation unit is proportional to a number of pixel units which are lacked in the column of pixel units corresponding to the load compensation unit.

In another aspect, a display apparatus including the display substrate described above is provided.

BRIEF DESCRIPTION OF THE DRAWINGS

By describing in detail exemplary embodiments of the present disclosure with reference to the drawings, features and advantages of the present disclosure will become more apparent.

DETAILED DESCRIPTION OF EMBODIMENTS

Figure 1:
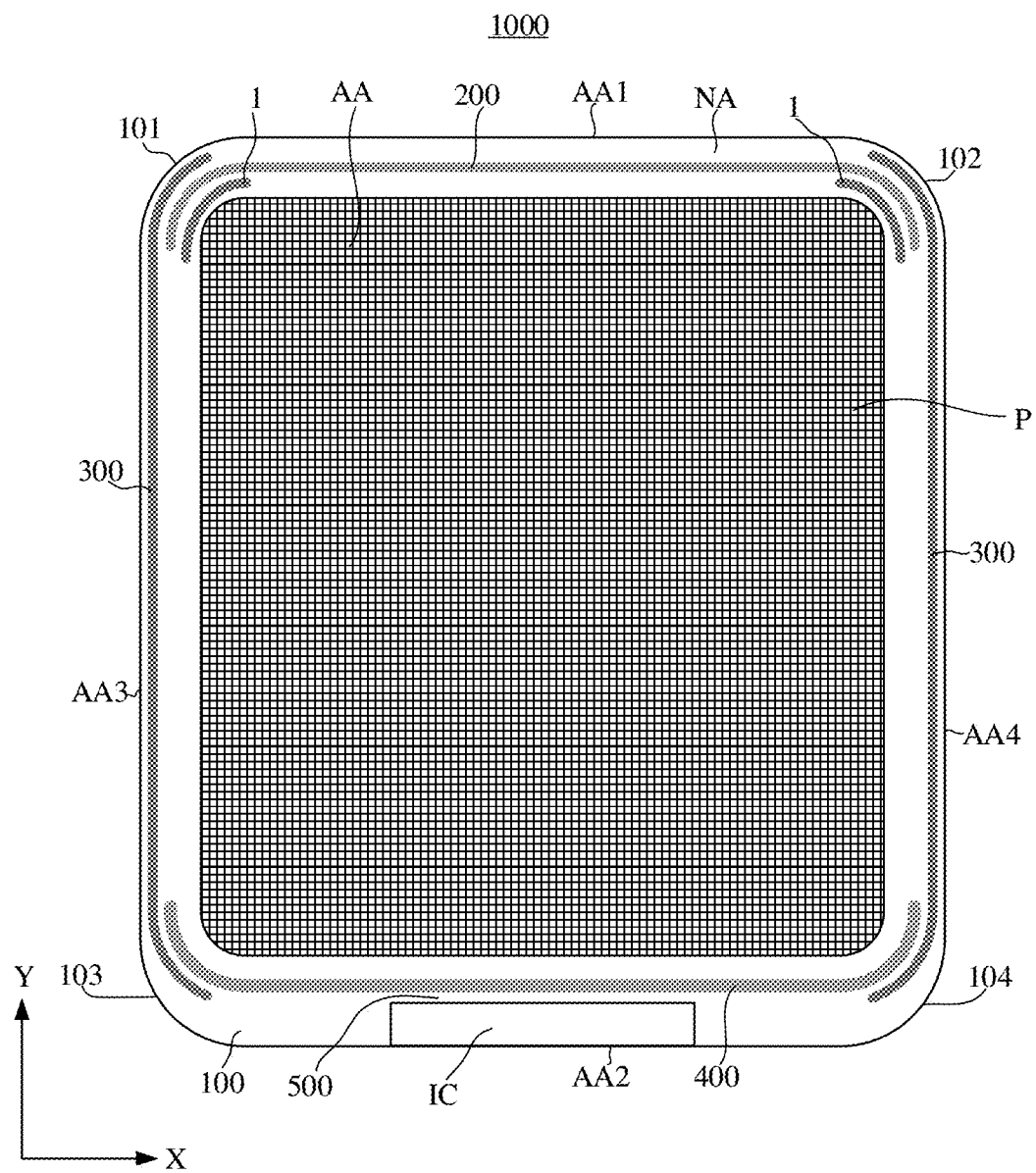
FIG. 1 shows a schematic top view of a display apparatus according to some exemplary embodiments of the present disclosure.

In order to make objectives, technical solutions and advantages of the present disclosure clearer, the technical solutions of embodiments of the present disclosure are clearly and completely described below with reference to the drawings. Obviously, the described embodiments are only a part rather than all of embodiments of the present disclosure. Based on embodiments of the present disclosure, all additional embodiments obtained by those ordinary skilled in the art without carrying out inventive effort fall within the scope of protection of the present disclosure.

It should be noted that, in the drawings, for clarity and/or description purposes, sizes and relative sizes of elements may be enlarged. Accordingly, the size and relative size of each element need not to be limited to those shown in the drawings. In the specification and drawings, the same or similar reference numerals indicate the same or similar components.

When an element is described as being "on", "connected to" or "coupled to" another element, the element may be directly on the other element, directly connected to the other element, or directly coupled to the other element, or an intermediate element may be provided. However, when an element is described as being "directly on", "directly connected to" or "directly coupled to" another element, no intermediate element is provided. Other terms and/or expressions configured to describe the relationship between elements, such as "between" and "directly between", "adjacent" and "directly adjacent", "on" and "directly on", and so on, should be interpreted in a similar manner. In addition, the term "connection" may refer to a physical connection, an electrical connection, a communication connection, and/or a fluid connection. In addition, X-axis, Y-axis and Z-axis are not limited to three axes of a rectangular coordinate system, and may be interpreted in a broader meaning. For example, the X-axis, the Y-axis and the Z-axis may be perpendicular to each other, or may represent different directions that are not perpendicular to each other. For the objective of the present disclosure, "at least one of X, Y and Z" and "at least one selected from a group consisting of X, Y and Z" may be interpreted as only X, only Y, only Z, or any combination of two or more of X, Y and Z, such as XYZ, XYY, YZ and ZZ. As used herein, the term "and/or" includes any and all combinations of one or more of the listed related items.

It should be noted that although the terms "first", "second", and so on may be used herein to describe various components, members, elements, regions, layers and/or parts, these components, members, elements, regions, layers and/or parts should not be limited by these terms. Rather, these terms are configured to distinguish one component, member, element, region, layer and/or part from another. Thus, for example, a first component, a first member, a first element, a first region, a first layer and/or a first part discussed below may be referred to as a second component, a second member, a second element, a second region, a second layer and/or a second part without departing from teachings of the present disclosure.

For ease of description, spatial relationship terms, such as "upper", "lower", "left", "right", etc. may be used herein to describe the relationship between one element or feature and another element or feature as shown in the figure. It should be understood that the spatial relationship terms are intended to cover other different orientations of the device in use or operation in addition to the orientation described in the figure. For example, if the device in the figure is turned upside down, an element or feature described as "below" or "under" another element or feature will be oriented "above" or "on" the other element or feature.

In the present disclosure, the terms "substantially", "about", "approximately" and other similar terms are used as terms of approximation rather than as terms of degree, and they are intended to explain an inherent deviation of a measured or calculated value that will be recognized by those ordinary skilled in the art. Taking into account process fluctuations, measurement problems, and errors related to measurements of specific quantities (that is, limitations of a measurement system), the terms "substantially", "about" or "approximately" used in the present disclosure includes the stated value and means that the specific value determined by those ordinary skilled in the art is within an acceptable range of deviation. For example, "about" may mean within one or more standard deviations, or within ±30%, ±20%, ±10% or ±5% of the stated value.

It should be noted that the expression of "same layer" herein refers to a layer structure formed by first using the same film forming process to form a film layer for forming a specific pattern, and then using the same mask to pattern the film layer by using a patterning process. Depending on the specific patterns, the patterning process may include multiple exposure, development or etching processes, and the specific pattern in the layer structure formed may be continuous or discontinuous. That is, a plurality of elements, components, structures and/or parts located in the "same layer" are made of the same material and formed by the same patterning process. Generally, a plurality of elements, components, structures and/or parts located in the "same layer" have substantially the same thickness.

Embodiments of the present disclosure provide at least a display substrate and a display apparatus. The display substrate includes: a base substrate, including a display area and a bezel area located on at least one side of the display area; a plurality of pixel units located in the display area, where the plurality of pixel units are arranged in an array along a row direction and a column direction on the base substrate, and each pixel unit includes a plurality of sub-pixels; a plurality of scanning signal lines disposed on the base substrate, where the plurality of scanning signal lines are configured to provide a scanning signal to a plurality of rows of sub-pixels, respectively; a gate driver circuit disposed on the base substrate and located in the bezel area, where the gate driver circuit is configured to output a scanning signal; a plurality of load compensation units disposed on the base substrate and located in the bezel area, where the plurality of load compensation units are located between the gate driver circuit and the plurality of pixel units; and a plurality of scanning signal lead wires disposed on the base substrate and located in the bezel area, the plurality of scanning signal lead wires are configured to transmit the scanning signal output by the gate driver circuit respectively to the plurality of scanning signal lines, where at least one of the scanning signal lead wires crosses at least one of the load compensation units in the row direction. In the display substrate and the display apparatus provided by embodiments of the present disclosure, the scanning signal lead wire(s) for supplying the scanning signal(s) are disposed above the load compensation unit(s), so as to form an overlap between the scanning signal lead wires and the load compensation units, so that the scanning signal lead wires may be compensated, thereby improving the stability of the scanning signal.

Figure 2:
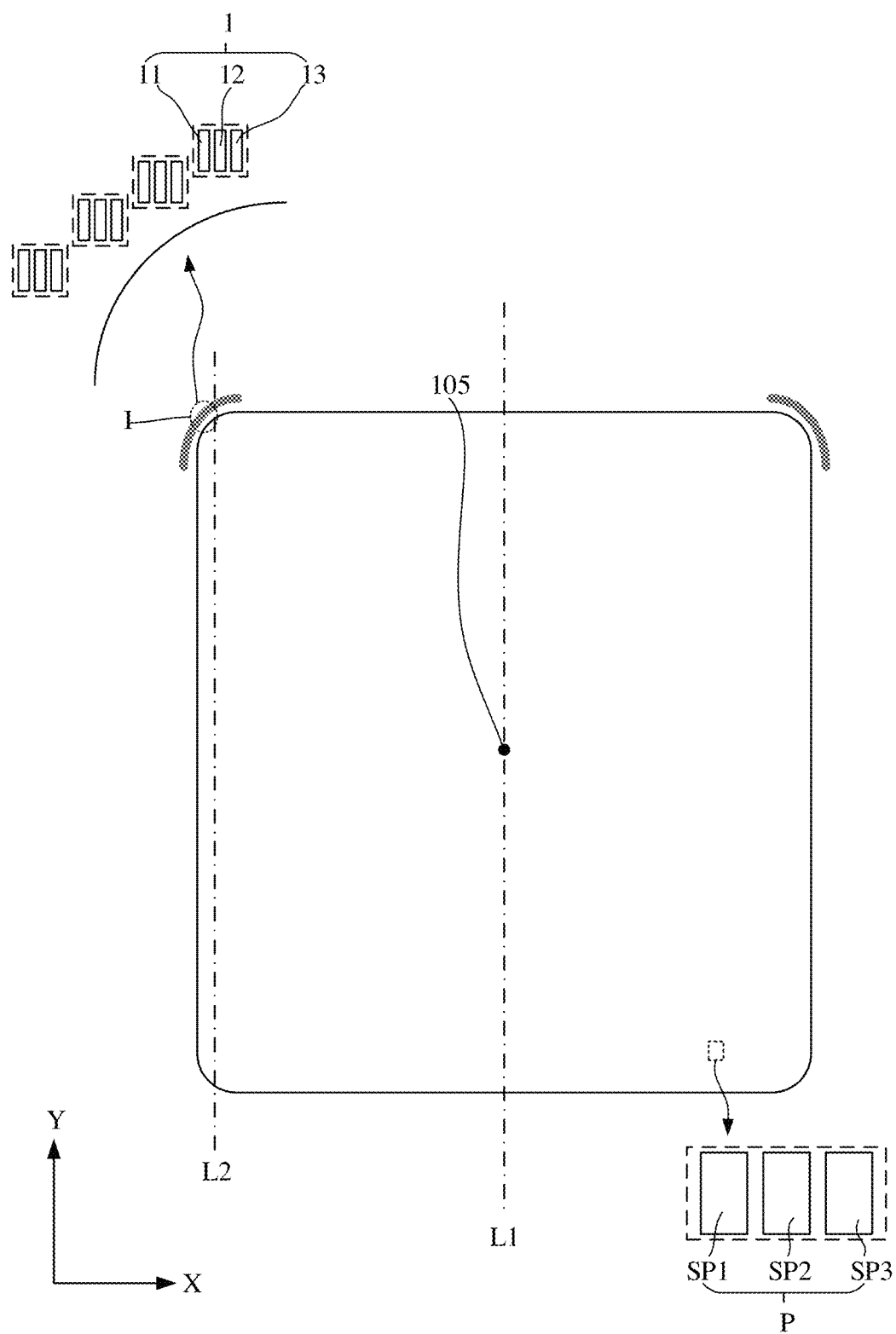
FIG. 2 shows a schematic top view of a display apparatus according to some exemplary embodiments of the present disclosure, where a pixel unit and a load compensation unit of a display substrate are schematically shown.

FIG. 1 shows a schematic top view of a display apparatus according to some exemplary embodiments of the present disclosure. FIG. 2 shows a schematic top view of a display apparatus according to some exemplary embodiments of the present disclosure, where a pixel unit and a load compensation unit of a display substrate are schematically shown.

Referring to FIG. 1 and FIG. 2 in combination, a display apparatus 1000 may include a display substrate. The display substrate may include a base substrate 100, and the base substrate 100 may include a display area AA and a bezel area NA which is located on at least one side of the display area. It should be noted that, in the embodiment shown in FIG. 1, the bezel area NA surrounds the display area AA, but embodiments of the present disclosure are not limited to this. In other embodiments, the bezel area NA may be located on at least one side of the display area AA without surrounding the display area AA.

The display substrate may include a plurality of pixel units P located in the display area AA. It should be noted that a pixel unit P is a smallest unit for displaying an image. For example, the pixel unit P may include a light emitting device that emits white light and/or color light.

A plurality of pixel units P may be arranged in the form of a matrix whose rows extends in a first direction (e.g., the row direction) and columns extends in a second direction (e.g., the column direction). However, the embodiments of the present disclosure do not specifically limit an arrangement form of the pixel units P, and the pixel units P may be arranged in various forms. For example, the pixel units P may be arranged such that a direction inclined with respect to the first direction X and the first direction Y is the column direction, and a direction crossing the column direction is the row direction.

A pixel unit P may include a plurality of sub-pixels. For example, a pixel unit P may include three sub-pixels, namely, a first sub-pixel SP1, a second sub-pixel SP2, and a third sub-pixel SP3. For another example, a pixel unit P may include four sub-pixels, namely, a first sub-pixel, a second sub-pixel, a third sub-pixel, and a fourth sub-pixel. For example, the first sub-pixel SP1 may be a red sub-pixel, the second sub-pixel SP2 may be a green sub-pixel, the third sub-pixel SP3 may be a blue sub-pixel, and the fourth sub-pixel may be a white sub-pixel.

Each sub-pixel may include a light emitting element, and a pixel driver circuit for driving the light emitting element. For example, the first sub-pixel SP1 may include a first light emitting element, and a first pixel driver circuit for driving the first light emitting element, and the first light emitting element may emit red light; the second sub-pixel SP2 may include a second light emitting element, and a second pixel driver circuit for driving the second light emitting element, and the second light emitting element may emit green light; and the third sub-pixel SP3 may include a third light emitting element, and a third pixel driver circuit for driving the third light emitting element, and the third light emitting element may emit blue light.

For example, in an OLED display panel, a light emitting element of a sub-pixel may include an anode electrode, a light emitting material layer, and a cathode electrode which are arranged in a stack. Therefore, a light emitting region of the sub-pixel may be a region corresponding to a part of the light emitting material layer sandwiched between the anode electrode and the cathode electrode.

Referring to FIG. 1, the display substrate may include a load compensation unit 1, a test circuit 200, a gate driver circuit 300, a multiplexer 400 and other components, which are all located in the peripheral region NA.

The display area AA may include a first boundary AA1, a second boundary AA2, a third boundary AA3, and a fourth boundary AA4 (e.g., an upper boundary, a lower boundary, a left boundary, and a right boundary) connected in sequence.

In some embodiments of the present disclosure, an orthographic projection of the display area AA on the base substrate 100 may have a shape of a rounded rectangle. For convenience of description, four rounded corners of the rounded rectangle may be respectively referred to as a first rounded corner portion 101, a second rounded corner portion 102, a third rounded corner portion 103, and a fourth rounded corner portion 104. For example, the first rounded corner portion 101 may be located at an upper left corner in FIG. 1, the second rounded corner portion 102 may be located at an upper right corner in FIG. 1, the third rounded corner portion 103 may be located at a lower left corner in FIG. 1, and the fourth rounded corner portion 104 may be located at a lower right corner in FIG. 1.

The test circuit 200 may be located on a side in the peripheral region NA adjacent to the first boundary AA1, and the test circuit 200 is arranged facing the first boundary AA1, the first rounded corner portion 101, and the second rounded corner portion 102.

For example, the test circuit 200 may include a plurality of test pins (which will be described below) that may be configured to provide a test signal. For example, the test signal may include a data signal used for the plurality of pixel units P in the display area AA.

The multiplexer 400 may be located on a side in the peripheral region NA adjacent to the second boundary AA2, and the multiplexer 400 is arranged facing the second boundary AA2, the third rounded corner portion 103 and the fourth rounded corner portion 104.

For example, the multiplexer 400 may perform time-division multiplex on signal lines in a wiring region. As shown in FIG. 1, the display substrate includes an integrated circuit IC disposed in the peripheral region NA, and a wiring region 500 located between the integrated circuit IC and the multiplexer 400. Various signals output by the integrated circuit IC may be transmitted to the multiplexer 400 through the signal lines in the wiring region 500. Under the control of a signal control terminal of the multiplexer 400, the various signals are output to the respective pixel units P in the display area AA. By providing the multiplexer 400, the number of signal lines disposed in the wiring region may be reduced, so that a pressure on wiring in the wiring region may be reduced.

The gate driver circuit 300 may be located on a side in the peripheral region NA adjacent to the third boundary AA3 and on a side in the peripheral region NA adjacent to the fourth boundary AA4. It should be noted that although FIG. 1 shows that the driver circuit is located on left and right sides of the display area AA, the embodiments of the present disclosure are not limited thereto, and the driver circuit may be located at any suitable position in the peripheral region NA.

For example, the gate driver circuit 300 may adopt a GOA (Gate Driver on Array) technology. In the GOA technology, a gate driver circuit instead of an external driving chip is directly disposed on an array substrate. Each GOA unit serves as a stage of shift register, and each stage of shift register is connected to a gate line. Various stages of shift registers sequentially output turn-on voltages in turn, so that a progressive scanning on pixels may be achieved. In some embodiments, each stage of shift register may also be connected to a plurality of gate lines. This may adapt to a development trend of high resolution and narrow bezel of the display substrate.

The display substrate may include a plurality of load compensation units 1. As shown in FIG. 1 and FIG. 2, some of the plurality of load compensation units 1 are located adjacent to the first rounded corner portion 101 in the peripheral region NA, and some others of the plurality of load compensation units 1 are located adjacent to the second rounded corner portion 102 in the peripheral region NA. The plurality of load compensation units 1 are all located between the test circuit 200 and the display area AA.

Figure 3:
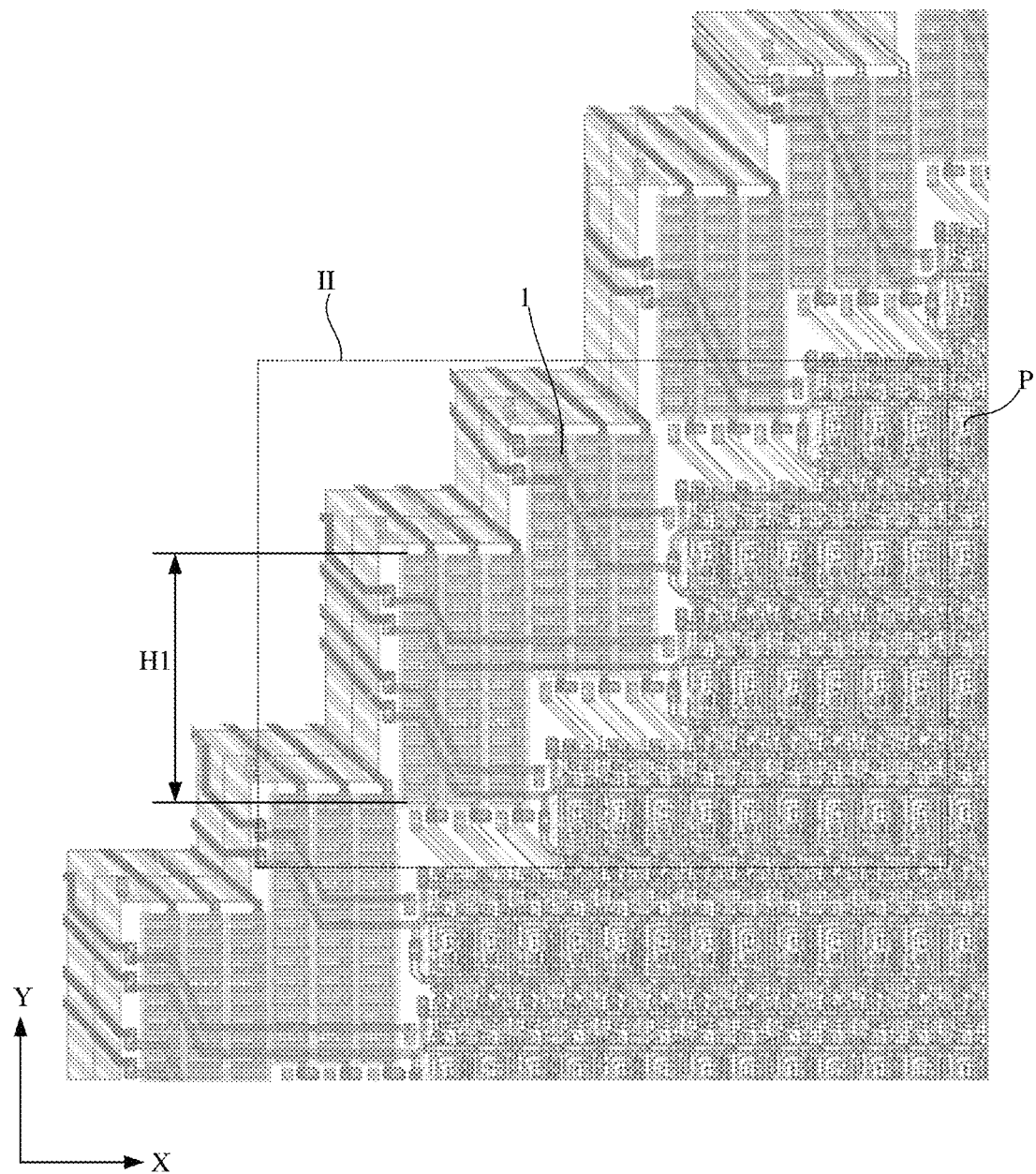
FIG. 3 shows a partial enlarged view of part I in FIG. 2.

FIG. 3 shows a partial enlarged view of part I in FIG. 2. Referring to FIG. 2 and FIG. 3 in combination, a plurality of sub-pixels are arranged in an array on the base substrate 100, that is, a plurality of rows of sub-pixels and a plurality of columns of sub-pixels are formed on the base substrate 100. For the plurality of columns of sub-pixels, since the display area AA has a rounded rectangular shape, the number of sub-pixels included in each of the columns of sub-pixels may be inconsistent.

Referring to FIG. 2, the rounded rectangle has a center 105. A first straight line L1 extends in the column direction Y and passes through the center 105. A second straight line L2 extends in the column direction Y and passes through a rounded corner of the rounded rectangle, for example, through the first rounded corner portion 101. In a region where the first straight line L1 is located, a column of sub-pixels include N sub-pixels. In a region where the second straight line L2 is located, a column of sub-pixels include M sub-pixels. Due to a presence of the rounded corner, M is less than N. Referring to FIG. 2 in combination, as the second straight line L2 gradually approaches the third boundary AA3, M may gradually decrease.

In the embodiments of the present disclosure, for convenience of description, a column of sub-pixels in the region where the first straight line L1 is located is referred to as a reference pixel column, and a column of sub-pixels corresponding to each rounded corner is referred to as an edge pixel column.

The display substrate further includes a plurality of data signal lines disposed on the base substrate 100, and the plurality of data signal lines are configured to provide a data signal to a plurality of columns of sub-pixels, respectively. Since the number of sub-pixels in an edge pixel column is less than the number of sub-pixels in the reference pixel column, a load on a data signal line for supplying a data signal to the edge pixel column is inconsistent with a load on a data signal line for supplying a data signal to the reference pixel column. Therefore, it is necessary to perform a load compensation on the edge pixel column, so as to make the loads on the respective data signal lines consistent, thereby avoiding a display difference and ensuring a display quality.

For example, the less the sub-pixels in an edge pixel column, the less a load on a data signal line for supplying a data signal to the edge pixel column, and the greater the load is required to be compensated. Therefore, optionally, in the display substrate provided by the embodiments of the present disclosure, the more the sub-pixels connected to a data signal line corresponding to a load compensation unit, the less a load value required to be compensated by the load compensation unit. The data signal lines corresponding to different numbers of sub-pixels are compensated by the load compensation units with different compensation load values, so as to uniform the loads on different data signal lines, which may avoid the display difference and ensure the display quality.

For example, the reference pixel column includes N sub-pixels, and the edge pixel column includes M sub-pixels. When compensating a load on a data signal line, a value of the load required to be compensated may be determined according to a difference between the number of sub-pixels included in the edge pixel column to be compensated and the number of sub-pixels included in the reference pixel column.

Figure 4:
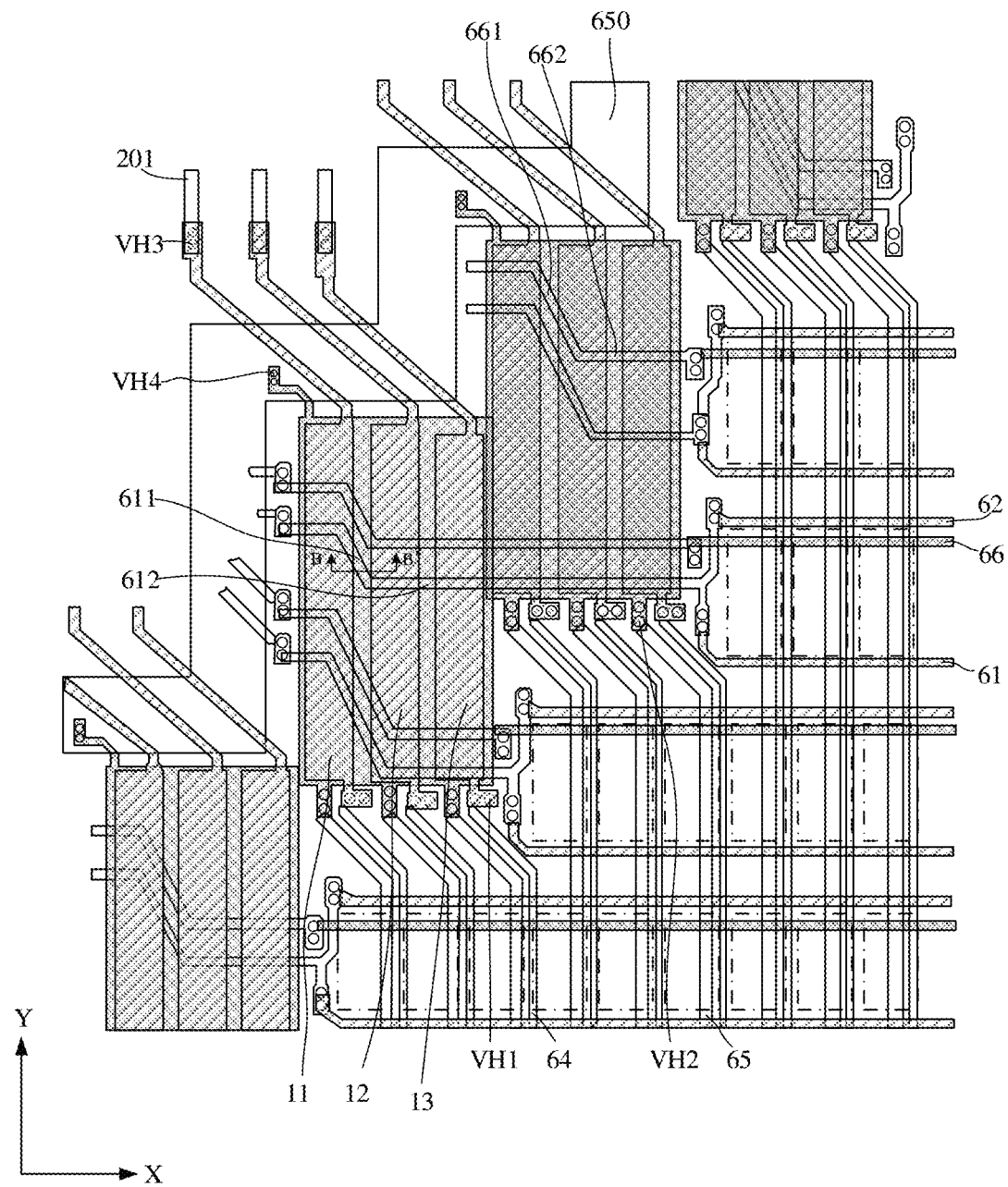
FIG. 4 shows a partial enlarged view of part II in FIG. 3.

FIG. 4 shows a partial enlarged view of part II in FIG. 3. Referring to FIG. 1 to FIG. 4 in combination, the plurality of load compensation units 1 are arranged along an outline of the rounded corner of the rounded rectangle.

Referring to FIG. 3 and FIG. 4, the plurality of load compensation units 1 are in a one-to-one correspondence with the plurality of columns of pixel units P. A pixel unit P may include a plurality of sub-pixels, for example, three sub-pixels (e.g., a first sub-pixel SP1, a second sub-pixel SP2, and a third sub-pixel SP3). A load compensation unit 1 may include a plurality of compensation capacitors, for example, three compensation capacitors. The plurality of compensation capacitors may include a first compensation capacitor 11, a second compensation capacitor 12, and a third compensation capacitor 13. In a group of a load compensation unit 1 and a column of pixel units P corresponding to the load compensation unit 1, the first compensation capacitor 11 may be configured to compensate a column of first sub-pixels SP1, the second compensation capacitor 12 may be configured to compensate a column of second sub-pixels SP2, and the third compensation capacitor 13 may be configured to compensate a column of third sub-pixels SP3.

In an embodiment of the present disclosure, each sub-pixel may include a light emitting element, and a pixel driver circuit for driving the light emitting element. In FIG. 4, a rectangular region surrounded by a dot-dash line represents a region of each sub-pixel. A 7T1C pixel driver circuit is illustrated below by way of example in describing a structure of a pixel driver circuit of each sub-pixel located in the display area AA in detail. However, the embodiments of the present disclosure are not limited to the 7T1C pixel driver circuit. In a case of no conflict, other known pixel driver circuit structures may be applied to the embodiments of the present disclosure.

Figure 5:
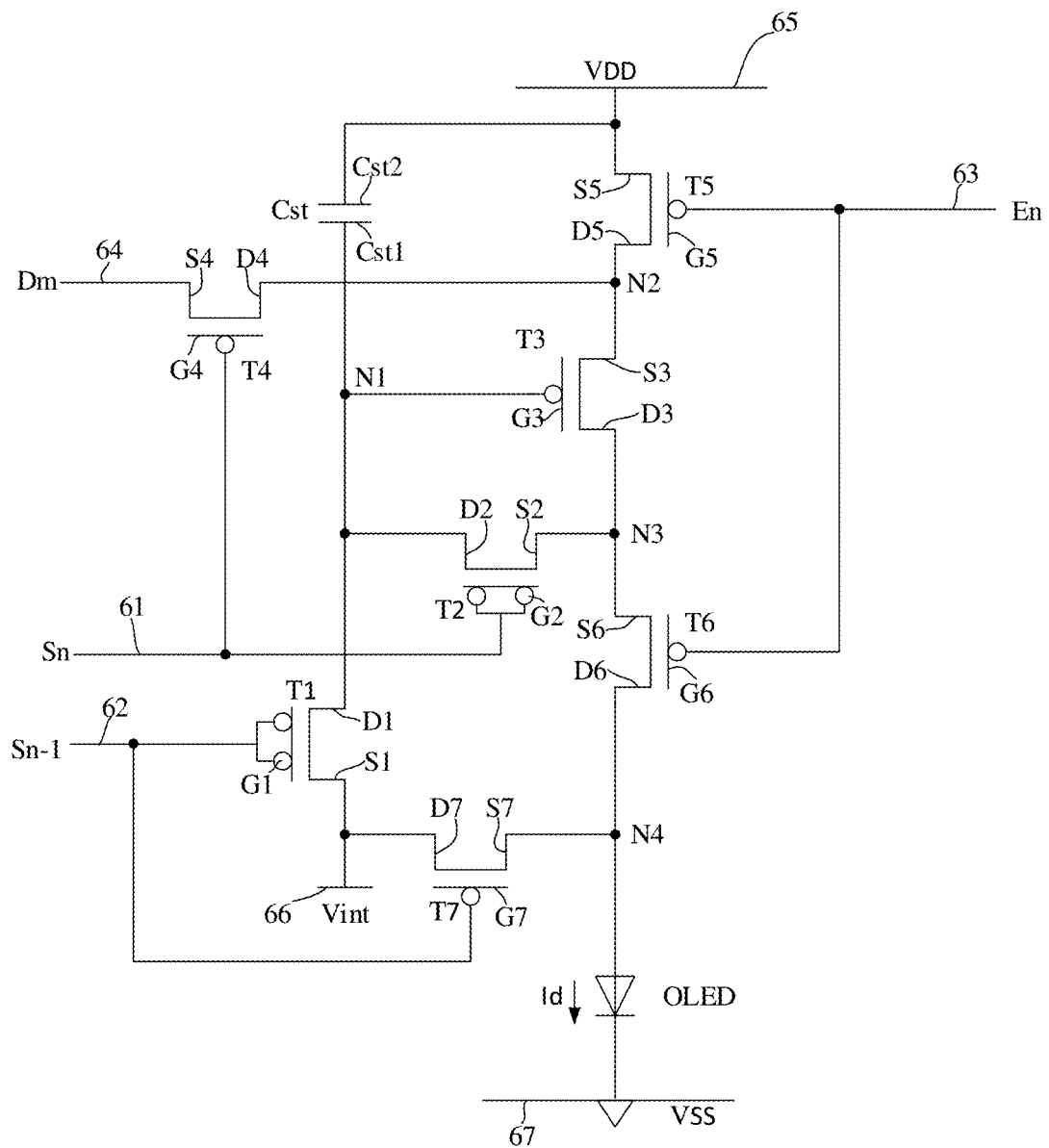
FIG. 5 shows an equivalent circuit diagram of a pixel driver circuit of a display substrate according to some exemplary embodiments of the present disclosure.
Figure 6:
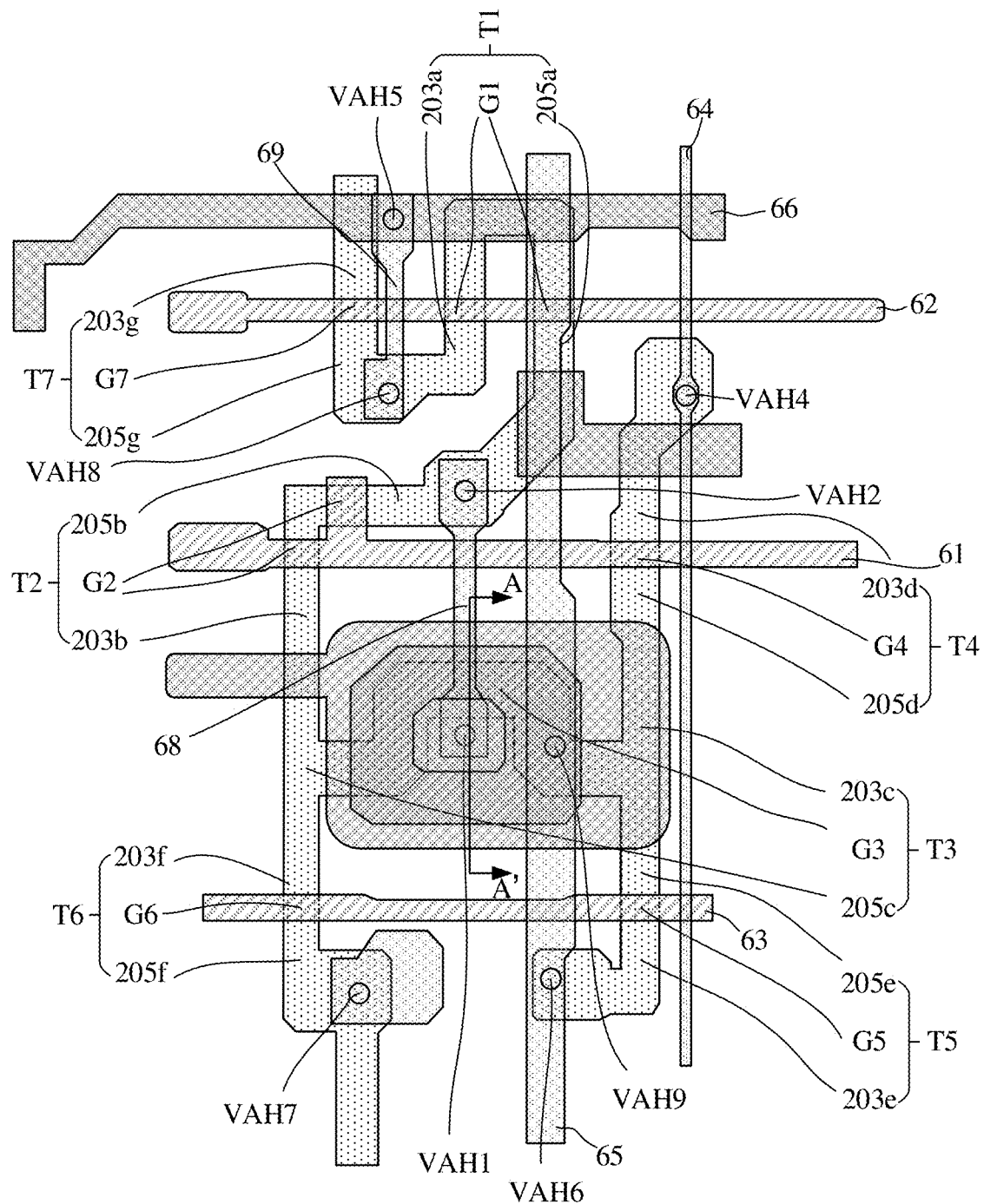
FIG. 6 shows a top view of an exemplary implementation of a sub-pixel in a display area of a display substrate according to some exemplary embodiments of the present disclosure.

FIG. 5 shows an equivalent circuit diagram of a pixel driver circuit of a display substrate according to some exemplary embodiments of the present disclosure. FIG. 6 shows a top view of an exemplary implementation of a sub-pixel in a display area of a display substrate according to some exemplary embodiments of the present disclosure. FIG. 7 to FIG. 10 show top views of some film layers of an exemplary implementation of the sub-pixel in FIG. 6. For example, a semiconductor layer, a first conductive layer, a second conductive layer, and a third conductive layer are schematically shown in FIG. 7 to FIG. 10, respectively.

Referring to FIG. 5 to FIG. 10 in combination, the pixel driver circuit may include a plurality of thin film transistors and a storage capacitor Cst. The pixel driver circuit is configured to drive an organic light-emitting diode (OLED). The plurality of thin film transistors may include a first transistor T1, a second transistor T2, a third transistor T3, a fourth transistor T4, a fifth transistor T5, a sixth transistor T6, and a seventh transistor T7. Each transistor may include a gate electrode, a source electrode, and a drain electrode.

The display substrate may further include a plurality of signal lines. For example, the plurality of signal lines may include: a scanning signal line 61 for transmitting a scanning signal Sn, a reset signal line 62 for transmitting a reset control signal RESET (namely a scanning signal for a previous row), a light emission control line 63 for transmitting a light emission control signal En, a data signal line 64 for transmitting a data signal Dm, a driving voltage line 65 for transmitting a driving voltage VDD, an initialization voltage line 66 for transmitting an initialization voltage Vint, and a power line 67 for transmitting a VSS voltage.

Figure 7:
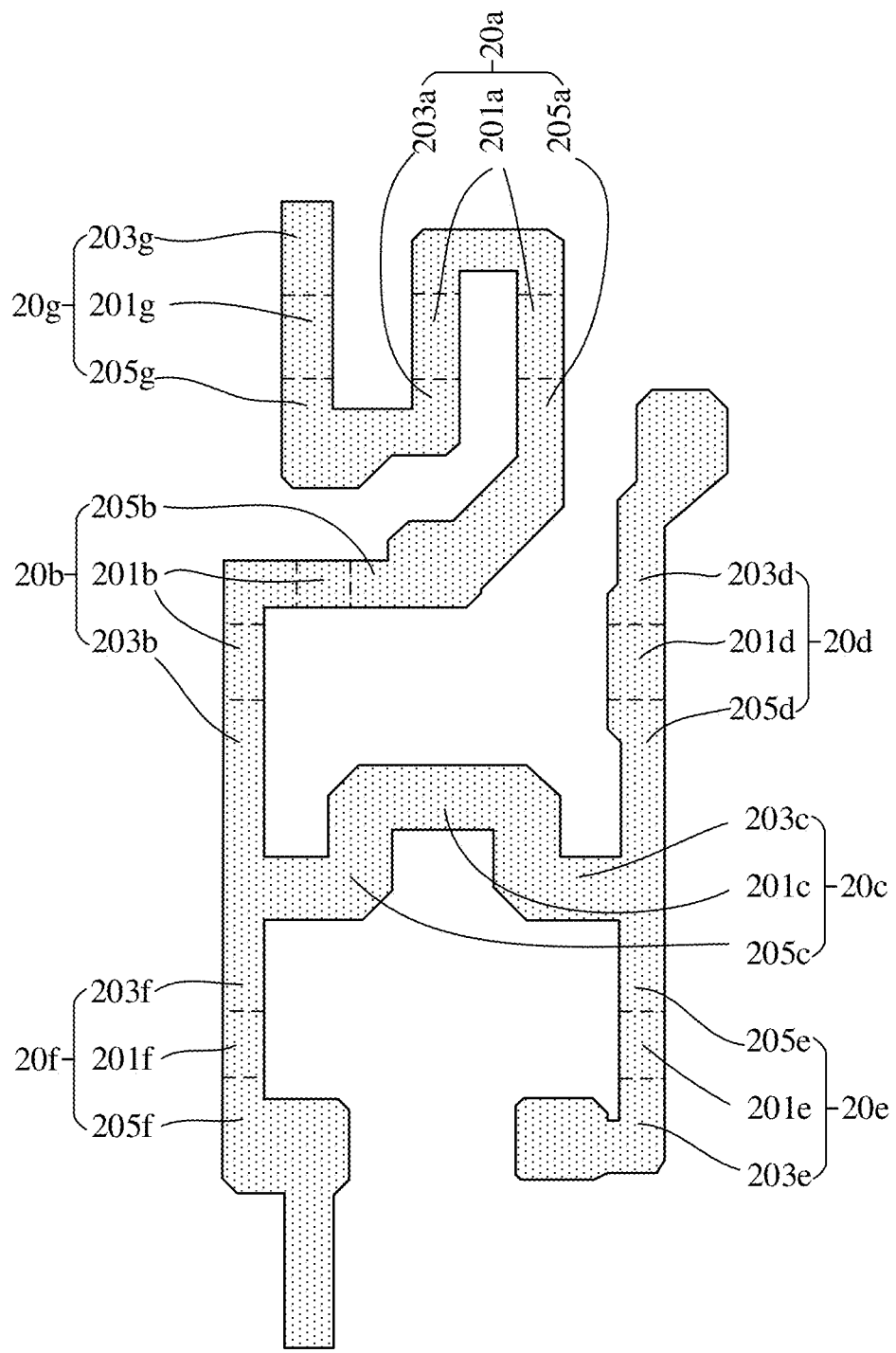
FIG. 7 to FIG. 10 show top views of some film layers of an exemplary implementation of the sub-pixel in FIG. 6, where a semiconductor layer, a first conductive layer, a second conductive layer, and a third conductive layer are schematically shown in FIG. 7 to FIG. 10, respectively.

The first transistor T1, the second transistor T2, the third transistor T3, the fourth transistor T4, the fifth transistor T5, the sixth transistor T6, and the seventh transistor T7 may be formed along an active layer (namely the semiconductor layer) as shown in FIG. 7. The active layer may have a curved or bent shape, and may include a first active layer 20a corresponding to the first transistor T1, a second active layer 20b corresponding to the second transistor T2, a third active layer 20c corresponding to the third transistor T3, a fourth active layer 20d corresponding to the fourth transistor T4, a fifth active layer 20e corresponding to the fifth transistor T5, a sixth active layer 20f corresponding to the sixth transistor T6, and a seventh active layer 20g corresponding to the seventh transistor T7.

The active layer may include, for example, polysilicon, and may include, for example, a channel region, a source region, and a drain region. The channel region may be non-doped or have a doping type different from those of the source region and the drain region, and therefore possess a semiconductor property. The source region and the drain region are respectively located on both sides of the channel region, and are doped with impurities, and therefore conductive. The impurities may vary depending on whether the TFT is an N-type transistor or a P-type transistor.

The first transistor T1 may include the first active layer 20a and a first gate electrode G1. The first active layer 20a may include a first channel region 201a, a first source region 203a, and a first drain region 205a. The first transistor T1 has the gate electrode G1 electrically connected to the reset signal line 62, a source electrode S1 electrically connected to the initialization voltage line 66, and a drain electrode D1 electrically connected to a terminal Cst1 of the storage capacitor Cst, a drain electrode D2 of the second transistor T2, and a gate electrode G3 of the third transistor T3. As shown in FIG. 4, the drain electrode D1 of the first transistor T1, the terminal Cst1 of the storage capacitor Cst, the drain electrode D2 of the second transistor T2, and the gate electrode G3 of the third transistor T3 are connected at a node N1. The first transistor T1 may be turned on in response to the reset control signal RESET transmitted through the reset signal line 62, so as to transmit the initialization voltage Vint to the gate electrode G1 of the third transistor T3, so that an initialization operation is performed to initialize a voltage of the gate electrode G3 of the third transistor T3. That is, the first transistor T1 is also referred to as an initialization transistor.

The second transistor T2 includes the second active layer 20b and a second gate electrode G2. The second active layer 20b may include a second channel region 201b, a second source region 203b, and a second drain region 205b. The second transistor T2 has the gate electrode G2 electrically connected to the scanning signal line 61, a source electrode S2 electrically connected to a node N3, and the drain electrode D2 electrically connected to the node N1. The second transistor T2 is turned on in response to the scanning signal Sn transmitted through the scanning signal line 61, so as to electrically connect the gate electrode G3 and the drain electrode D3 of the third transistor T3, realizing a diode connection of the third transistor T3.

The third transistor T3 includes the third active layer 20c and a third gate electrode G3. The third active layer 20c includes a third source region 203c, a third drain region 205c, and a third channel region 201c connecting the third source region 203c and the third drain region 205c. The third source region 203c and the third drain region 205c extend in two opposite directions with respect to the third channel region 201c. The third source region 203c of the third transistor T3 is connected to a fourth drain region 205d and a fifth drain region 205e. The third drain region 205c is connected to the second source region 203b and a sixth source region 203f. The gate electrode G3 of the third transistor T3 is electrically connected to the node N1 through via holes VAH1 and VAH2, and a first connection line 68. The third transistor T3 has the gate electrode G3 electrically connected to the node N1, a source electrode S3 electrically connected to a node N2, and a drain electrode D3 electrically connected to the node N3. The third transistor T3 may receive the data signal Dm in response to a switching operation of the fourth transistor T4, so as to supply a driving current Id to the OLED. That is, the third transistor T3 is also referred to as a driving transistor.

The fourth transistor T4 includes the fourth active layer 20d and a fourth gate electrode G4. The fourth active layer 20d may include a fourth channel region 201d, a fourth source region 203d, and a fourth drain region 205d. The fourth transistor T4 is used as a switching device for selecting a target light emitting sub-pixel. The fourth gate electrode G4 is connected to the scanning signal line 61, the fourth source region 203d is connected to the data signal line 64 through a via hole VAH4, and the fourth drain region 205d is connected to the first transistor T1 and the fifth transistor T5, that is, the fourth drain region 205d is electrically connected to the node N2. The fourth transistor T4 is turned on in response to the scanning signal Sn transmitted through the scanning signal line 61, so that a switching operation is performed to transmit the data signal Dm to the source electrode S3 of the third transistor T3.

The fifth transistor T5 includes the fifth active layer 20e and a fifth gate electrode G5. The fifth active layer 20e may include a fifth channel region 201e, a fifth source region 203e, and a fifth drain region 205e. The fifth source region 203e may be connected to the driving voltage line 65 through a via hole VAH6. The fifth transistor T5 has the gate electrode G5 electrically connected to the light emission control line 63, a source electrode S5 electrically connected to the driving voltage line 65, and a drain electrode D5 electrically connected to the node N2.

The sixth transistor T6 includes the sixth active layer 20f and a sixth gate electrode G6. The sixth active layer 20f may include a sixth channel region 201f, a sixth source region 203f, and a sixth drain region 205f. The sixth drain region 205f may be connected to the anode electrode of the OLED through a via hole VAH7. The sixth transistor T6 has the gate electrode G6 electrically connected to the light emission control line 63, a source electrode S6 electrically connected to the node N3, and a drain electrode D6 electrically connected to a node N4, that is, the drain electrode D6 is electrically connected to the anode electrode of the OLED. The fifth transistor T5 and the sixth transistor T6 may be turned on concurrently (for example, simultaneously) in response to the light emission control signal En transmitted through the light emission control line 63, so as to transmit the driving voltage VDD to the OLED, thereby allowing the driving current Id to flow into the OLED.

The seventh transistor T7 includes the seventh active layer 20g and a seventh gate electrode G7. The seventh active layer 20g may include a seventh source region 203g, a seventh drain region 205g, and a seventh channel region 201g. The seventh drain region 205g is connected to the first source region 203a of the first transistor T1. The seventh drain region 205g may be electrically connected to the initialization voltage line 66 through a via hole VAH8, a second connection line 69, and a via hole VAH5. The seventh transistor T7 has the gate electrode G7 electrically connected to the reset signal line 62, a source electrode S7 electrically connected to the node N4, and a drain electrode D7 electrically connected to the initialization voltage line 66.

The storage capacitor Cst has the terminal (hereinafter referred to as a first capacitor electrode) Cst1 electrically connected to the node N1, and another terminal (hereinafter referred to as a second capacitor electrode) Cst2 electrically connected to the driving voltage line 65.

The OLED has the anode electrode electrically connected to the node N4, and a cathode electrode electrically connected to the power line 67 to receive a common voltage VSS. Accordingly, the OLED may receive the driving current Id from the third transistor T3 to emit light, so as to display an image.

It should be noted that in FIG. 4, the thin film transistors T1, T2, T3, T4, T5, T6, and T7 are p-channel field effect transistors. However, embodiments of the present disclosure are not limited thereto. At least some of the thin film transistors T1, T2, T3, T4, T5, T6 and T7 may be n-channel field effect transistors.

In operation, in an initialization phase, the reset control signal RESET at a low level is supplied through the reset signal line 62. Subsequently, the first transistor T1 may be turned on based on the low level of the reset control signal RESET, and the initialization voltage Vint from the initialization voltage line 66 is transmitted to the gate electrode G1 of the third transistor T3 through the first transistor T1. Then, the third transistor T3 is initialized due to the initialization voltage Vint.

In a data programming phase, the scanning signal Sn at a low level is supplied through the scanning signal line 61. Subsequently, the fourth transistor T4 and the second transistor T2 may be turned on based on the low level of the scanning signal Sn. Then, the third transistor T3 is placed in a diode-connection state by the turned-on second transistor T2 and is biased in a forward direction.

Subsequently, a compensation voltage (Dm+Vth) (for example, Vth is of a negative value) obtained by subtracting a threshold voltage Vth of the third transistor T3 from the data signal Dm supplied through the data signal line 64 is applied to the gate electrode G3 of the third transistor T3. Next, the driving voltage VDD and the compensation voltage (Dm+Vth) are applied to both terminals of the storage capacitor Cst, so that electric charges corresponding to a voltage difference between the corresponding terminals are stored into the storage capacitor Cst.

In a light emission phase, the light emission control signal En from the light emission control line 63 changes from being at a high level to being at a low level. Subsequently, in the light emission phase, the fifth transistor T5 and the sixth transistor T6 may be turned on in response to the low level of the light emission control signal En.

Next, a driving current is generated based on a difference between the voltage of the gate electrode G3 of the third transistor T3 and the driving voltage VDD. The driving current Id corresponding to a difference between the driving current and a bypass current is supplied to the OLED through the sixth transistor T6.

In the light emission phase, based on a current-voltage relationship of the third transistor T3, a gate-source voltage of the third transistor T3 is maintained at ((Dm+Vth)−VDD) due to the presence of the storage capacitor Cst. The driving current Id is proportional to (Dm−VDD)2. Therefore, the driving current Id may not be affected by a variation in the threshold voltage Vth of the third transistor T3.

Figure 11:
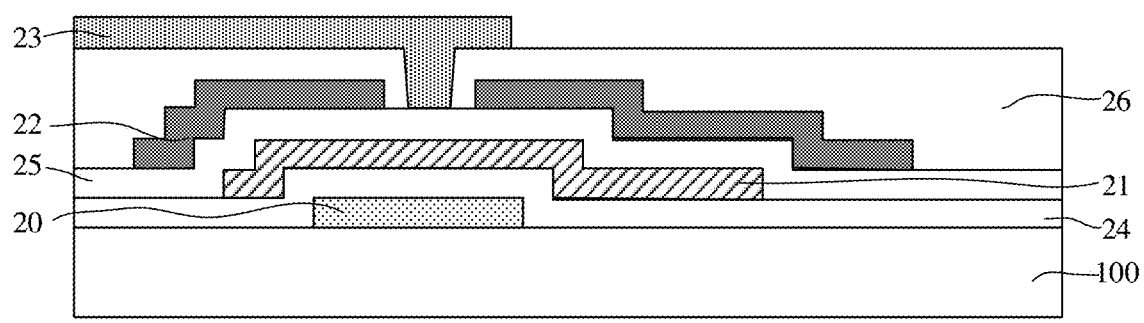
FIG. 11 shows a schematic diagram of a sectional structure of the display substrate taken along line AA' in FIG. 6, according to some exemplary embodiments of the present disclosure.

FIG. 11 shows a schematic diagram of a sectional structure of the display substrate taken along line AA' in FIG. 6, according to some exemplary embodiments of the present disclosure.

Referring to FIG. 6 to FIG. 11 in combination, the display substrate may include the base substrate 100 and a plurality of film layers disposed on the base substrate 100. In some embodiments, the plurality of film layers include at least a semiconductor layer 20, a first conductive layer 21, a second conductive layer 22, and a third conductive layer 23, which are sequentially disposed in a direction away from the base substrate 100. The plurality of film layers may further include at least a plurality of insulation film layers, which may include, for example, a first gate insulation layer 24, a second gate insulation layer 25, and an interlayer insulation layer 26. The first gate insulation layer 24 may be disposed between the semiconductor layer 20 and the first conductive layer 21, the second gate insulation layer 25 may be disposed between the first conductive layer 21 and the second conductive layer 22, and the interlayer insulation layer 26 may be disposed between the second conductive layer 22 and the third conductive layer 23.

For example, the semiconductor layer 20 may be formed of a semiconductor material such as low-temperature polysilicon, and may have a film layer thickness in a range of 400 angstroms to 800 angstroms, such as 500 angstroms. The first conductive layer 21 and the second conductive layer 22 may be formed of a conductive material that forms the gate electrode of the thin film transistor. For example, the conductive material may be Mo. The first conductive layer 21 and the second conductive layer 22 may have a film layer thickness in a range of 2000 angstroms to 4000 angstroms, such as 3000 angstroms. The third conductive layer 23 may be formed of a conductive material that forms the source electrode and the drain electrode of the thin film transistor. For example, the conductive material may include Ti, Al, etc. The third conductive layer 23 may have a stacked structure formed of Ti/Al/Ti, and have a film layer thickness in a range of 6000 angstroms to 9000 angstroms. For example, in the case that the third conductive layer 23 has the stacked structure formed of Ti/Al/Ti, the respective layers of the stacked structure formed of Ti/Al/Ti may have a thickness of about 500 angstroms, a thickness of about 6000 angstroms, and a thickness of about 500 angstroms, respectively. For example, the first gate insulation layer 24 and the second gate insulation layer 25 may be formed of silicon oxide, silicon nitride, or silicon oxynitride, and each of the first gate insulation layer 24 and the second gate insulation layer 25 may have a thickness of about 1000 angstroms to 2000 angstroms. For example, the interlayer insulation layer 26 may be formed of silicon oxide, silicon nitride, or silicon oxynitride, and may have a thickness of about 3000 angstroms to 6000 angstroms.

The display substrate includes the scanning signal line 61, the reset signal line 62, the light emission control line 63, and the initialization voltage line 66 that are arranged in the row direction to respectively apply the scanning signal Sn, the reset control signal RESET, the light emission control signal En, and the initialization voltage Vint to sub-pixels 11, 12, and 13. The display substrate may further include the data signal line 64 and the driving voltage line 65 that cross the scanning signal line 61, the reset signal line 62, the light emission control line 63, and the initialization voltage line 66 to respectively apply the data signal Dm and the driving voltage VDD to a sub-pixel 10.

Figure 8:
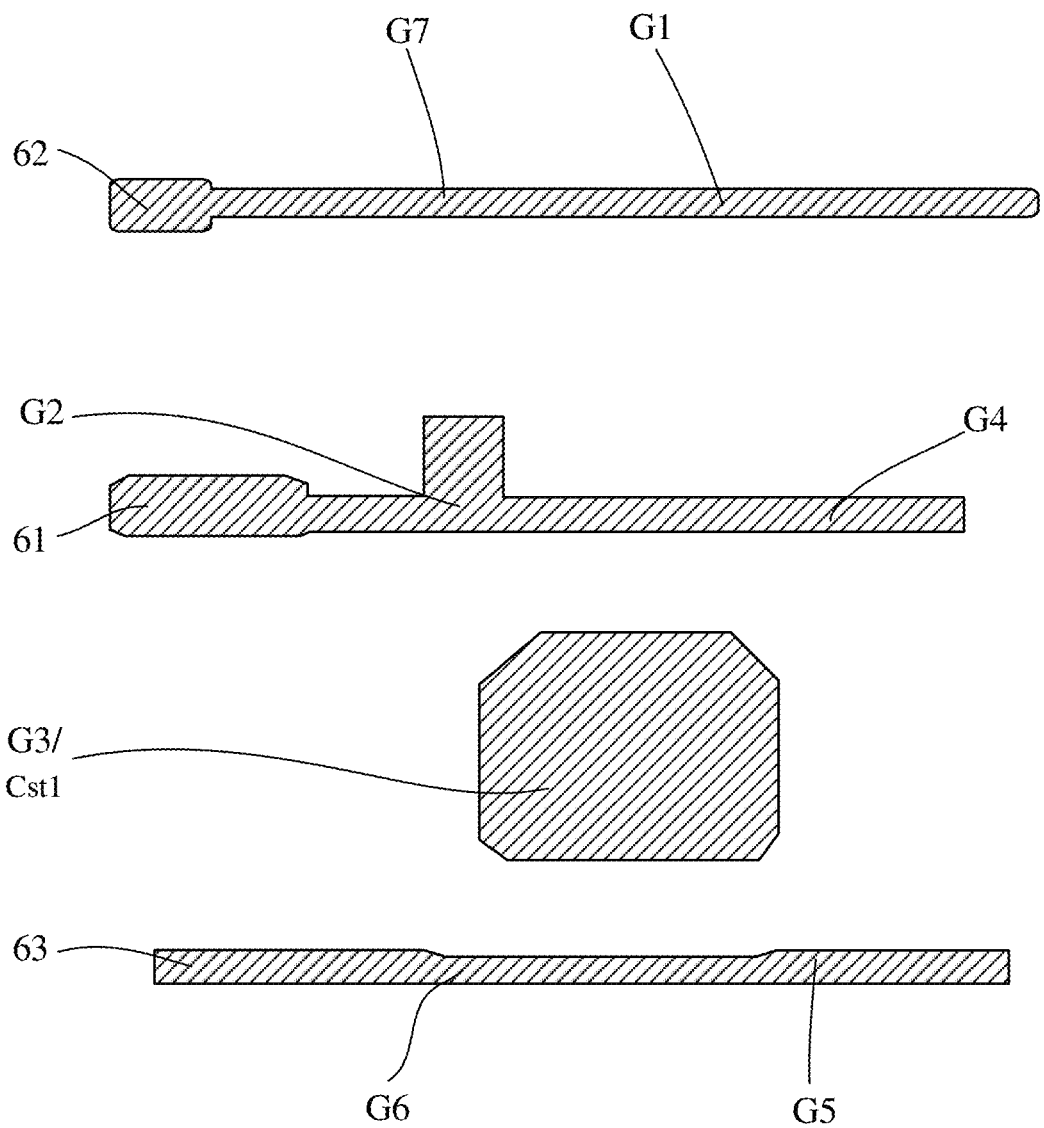

As shown in FIG. 8, the scanning signal line 61, the reset signal line 62, and the light emission control line 63 are all located in the first conductive layer 21. The gate electrodes G1 to G7 of the respective transistors are also located in the first conductive layer 21. For example, parts of the reset signal line 62 overlapping with the semiconductor layer 20 respectively form the gate electrode G1 of the first transistor T1 and the gate electrode G7 of the seventh transistor T7, parts of the scanning signal line 61 overlapping with the semiconductor layer 20 respectively form the gate electrode G2 of the second transistor T2 and the gate electrode G4 of the fourth transistor T4, and parts of the light emission control line 63 overlapping with the semiconductor layer 20 respectively form the gate electrode G6 of the sixth transistor T6 and the gate electrode G5 of the fifth transistor T5.

Continuing to refer to FIG. 8, the display substrate may further include a plurality of first gate structures CG1. The plurality of first gate structures CG1 are also located in the first conductive layer 21. A part of the first gate structure CG1 that overlaps with the semiconductor layer 20 forms the third gate electrode G3 of the third transistor T3. The first gate structure CG1 further forms a terminal of the storage capacitor Cst, for example, the first capacitor electrode Cst1. That is, the third transistor T3 and the storage capacitor Cst share the first gate structure CG1 simultaneously as the gate electrode of the third transistor T3 and an electrode of the storage capacitor Cst.

Figure 9:
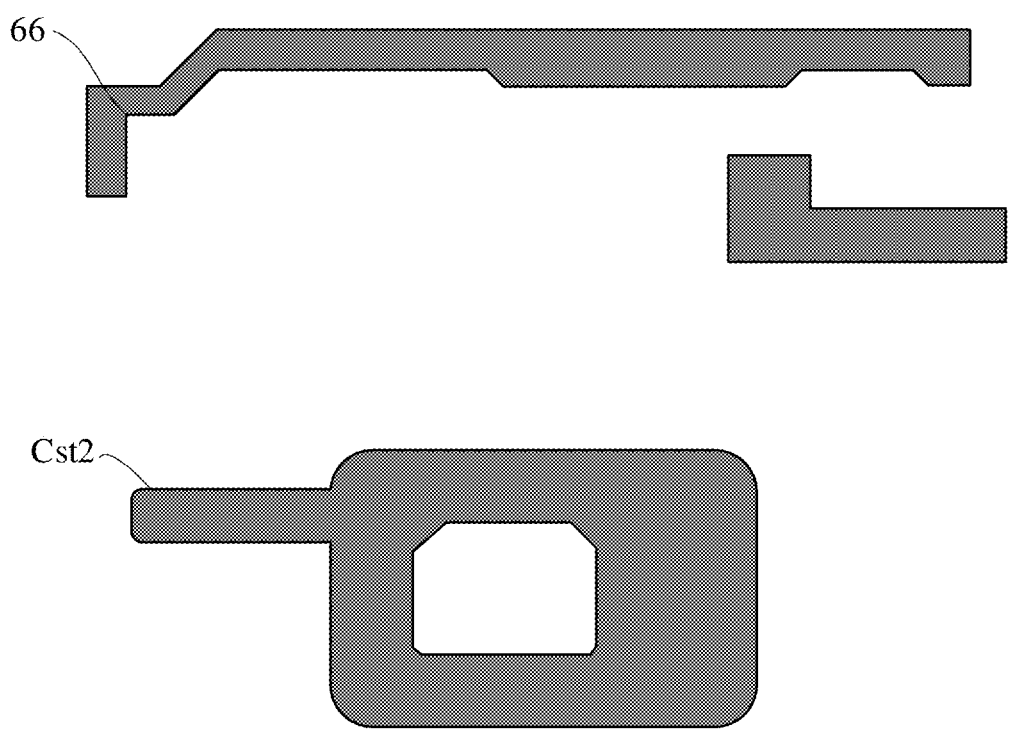

As shown in FIG. 9, the initialization voltage line 66 is located in the second conductive layer 22. The display substrate may further include a plurality of second gate structures CG2. The plurality of second gate structures CG2 are also located in the second conductive layer 22. The second gate structure CG2 forms another terminal of the storage capacitor Cst, for example, the second capacitor electrode Cst2. That is, the first gate structure CG1 and the second gate structure CG2 are arranged facing each other, where orthographic projections of the two on the base substrate 100 at least partially overlap with each other, and the second gate insulation layer 25 is disposed between the two. For example, the first gate structure CG1 may be electrically connected to the node N1 through the via holes VAH1 and VAH2, and the first connection line 68, and the second gate structure CG2 may be electrically connected to the driving voltage line 65 through a via hole VAH9. That is, the first gate structure CG1 and the second gate structure CG2 are connected to different voltage signals. In this way, the overlapping parts of the first gate structure CG1 and the second gate structure CG2 may form the storage capacitor Cst.

Figure 10:
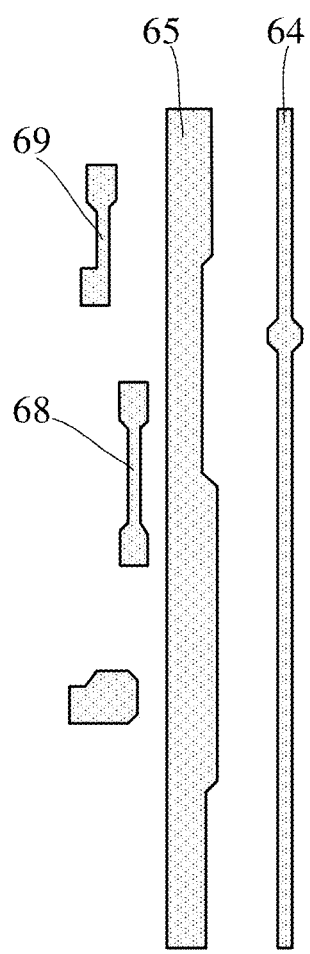

As shown in FIG. 10, the data signal line 64 and the driving voltage line 65 are located in the third conductive layer 23. In addition, the first connection line 68 and the second connection line 69 are also located in the third conductive layer 23.

Figure 12:
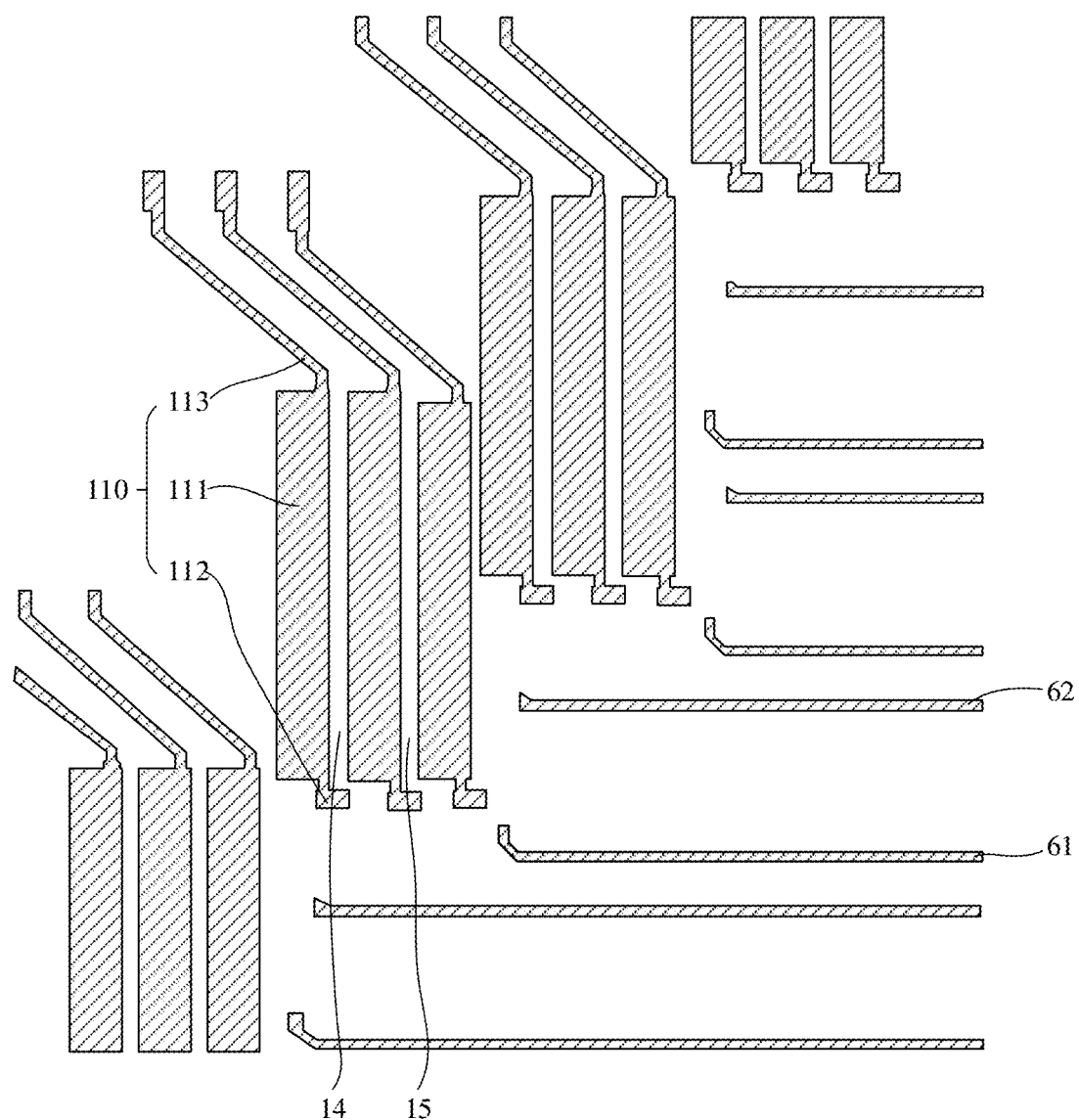
FIG. 12 to FIG. 14 respectively show schematic diagrams of the respective layers in FIG. 4, where FIG. 12 schematically shows a partial top view of the first conductive layer, FIG. 13 schematically shows a partial top view of the second conductive layer, and FIG. 14 schematically shows a partial top view of the third conductive layer.
Figure 13:
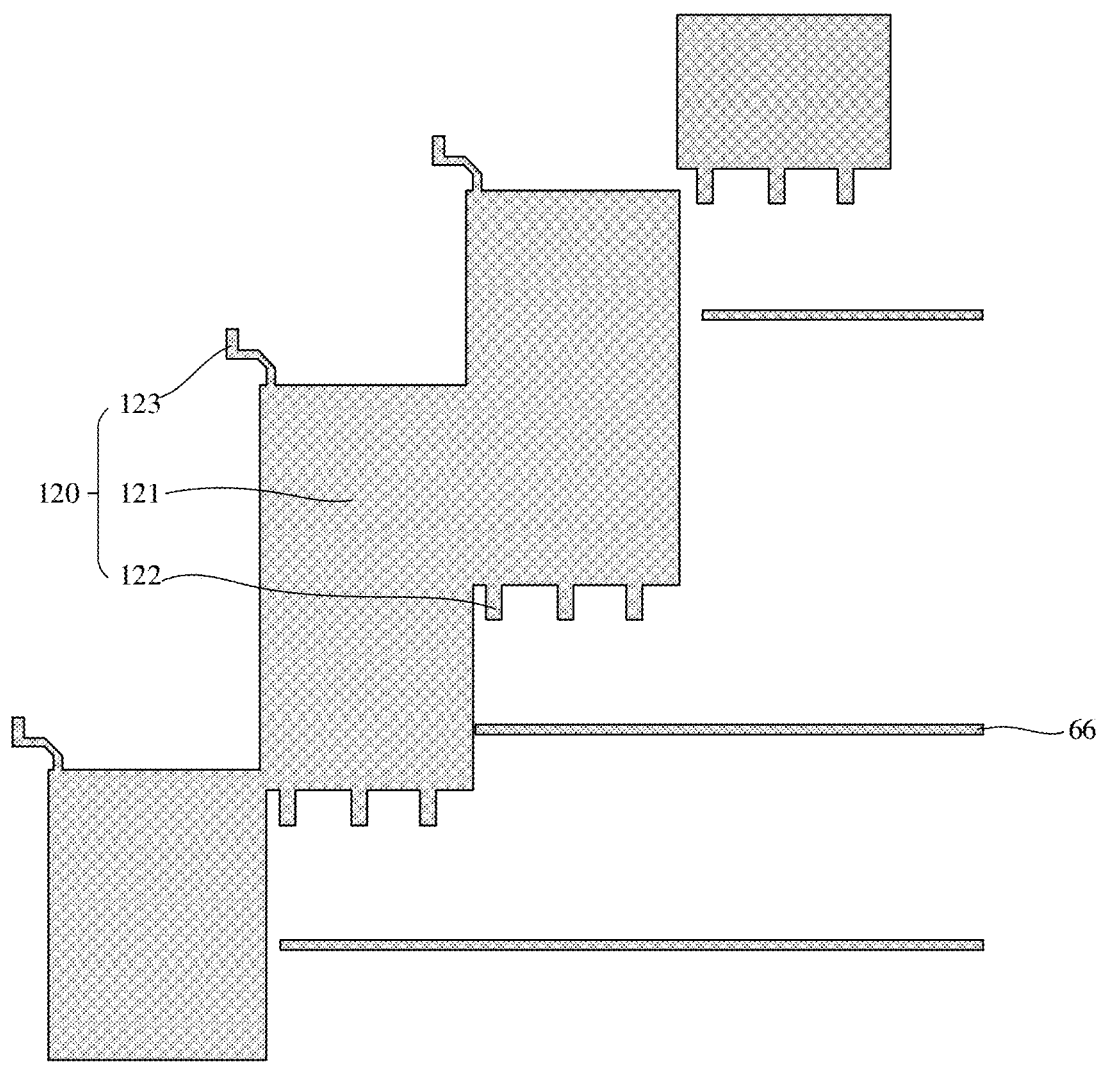
Figure 14:
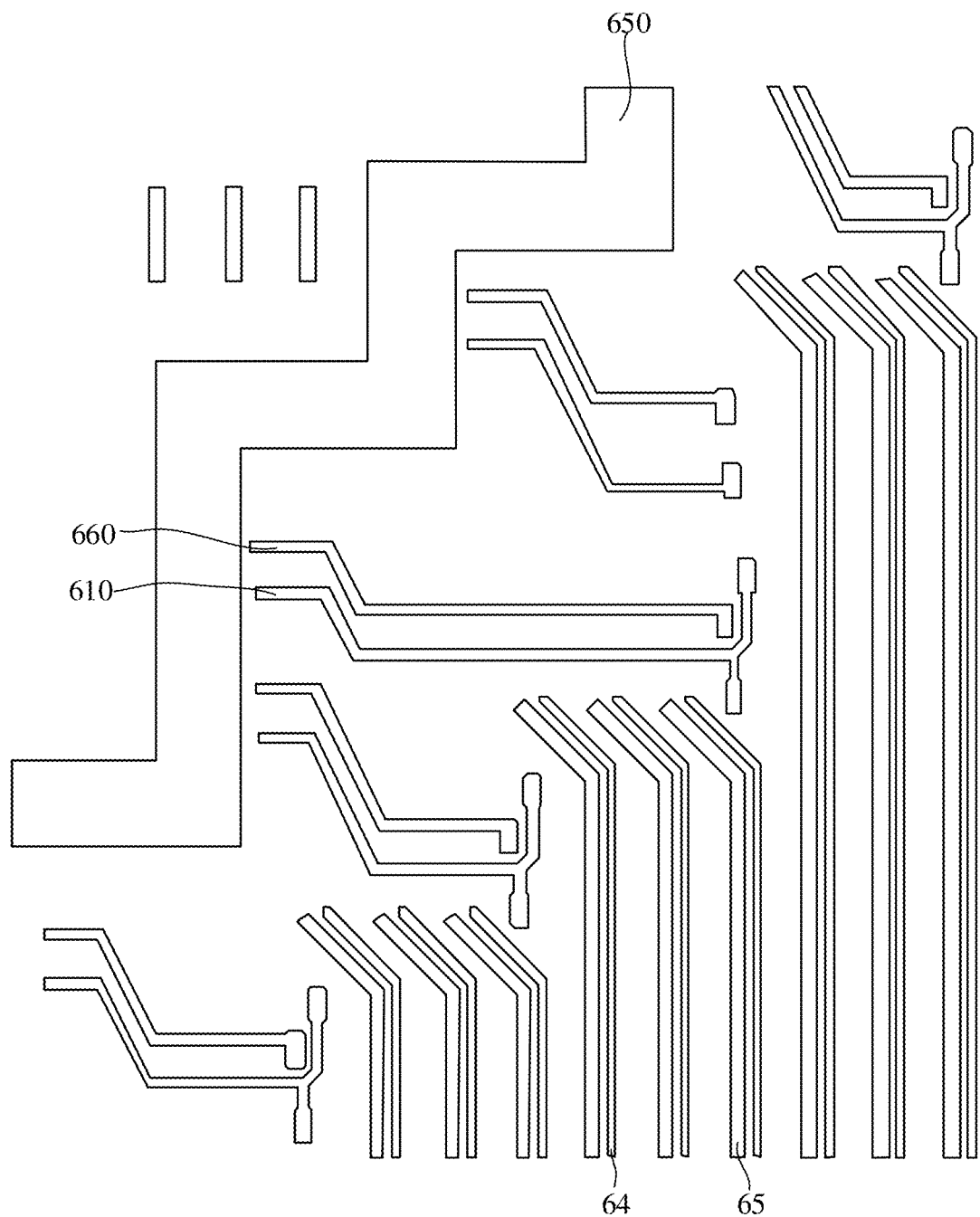

FIG. 12 to FIG. 14 respectively show schematic diagrams of the respective layers in FIG. 4, where FIG. 12 schematically shows a partial top view of the first conductive layer, FIG. 13 schematically shows a partial top view of the second conductive layer, and FIG. 14 schematically shows a partial top view of the third conductive layer. It should be noted that in order to clearly show the structure of the embodiments of the present disclosure, a plane structure of the respective sub-pixels in the display area AA is omitted in FIG. 12 to FIG. 14. For details of the plane structure of the respective sub-pixels, reference may be made to the above description for FIG. 5 to FIG. 10.

Referring to FIG. 4 and FIG. 12 to FIG. 14 in combination, each compensation capacitor may include a first compensation capacitor electrode 110 and a second compensation capacitor electrode 120. The first compensation capacitor electrode 110 is located in the first conductive layer 21, and the second compensation capacitor electrode 120 is located in the second conductive layer 22.

The first compensation capacitor electrode 110 and the second compensation capacitor electrode 120 are arranged facing each other, orthographic projections of the two on the base substrate at least partially overlap with each other, and the second gate insulation layer 25 is disposed between the two. For example, the first compensation capacitor electrode 110 may be electrically connected to the data signal, and the second compensation capacitor electrode 120 may be electrically connected to the driving voltage, that is, the two are connected to different voltage signals. In this way, the overlapping parts of the first compensation capacitor electrode 110 and the second compensation capacitor electrode 120 may form the compensation capacitor.

In some exemplary embodiments of the present disclosure, within a load compensation unit, first compensation capacitor electrodes 110 of a plurality of compensation capacitors are spaced apart from each other, that is, there is a gap provided between any two adjacent first compensation capacitor electrodes 110.

For example, in the illustrated embodiment, the load compensation unit 1 may include three compensation capacitors, namely, the first compensation capacitor 11, the second compensation capacitor 12, and the third compensation capacitor 13. A first compensation capacitor electrode 110 of the first compensation capacitor 11, a first compensation capacitor electrode 110 of the second compensation capacitor 12, and a first compensation capacitor electrode 110 of the third compensation capacitor 13 are spaced apart from each other. That is, there is a first gap 14 provided between the first compensation capacitor electrode 110 of the first compensation capacitor 11 and the first compensation capacitor electrode 110 of the second compensation capacitor 12, and there is a second gap 15 provided between the first compensation capacitor electrode 110 of the second compensation capacitor 12 and the first compensation capacitor electrode 110 of the third compensation capacitor 13.

For example, in the illustrated embodiment, each of the first compensation capacitor electrodes 110 may extend in the column direction Y, the plurality of first compensation capacitor electrodes 110 within the load compensation unit 1 may be arranged at intervals in the row direction X, and each of the first gap 14 and the second gap 15 extends in the column direction Y.

In some exemplary embodiments of the present disclosure, within one load compensation unit, second compensation capacitor electrodes 120 of a plurality of compensation capacitors are connected to each other. In other words, the plurality of second compensation capacitor electrodes 120 of the load compensation unit are formed as a continuously extending integral structure.

For example, in the load compensation unit 1, orthographic projections of the first compensation capacitor electrodes 110 of the plurality of compensation capacitors on the base substrate 100 falls within an orthographic projection of the plurality of second compensation capacitor electrodes 120 that are connected to each other on the base substrate 100. This is beneficial to an increase of an area of an overlapping region between the first compensation capacitor electrodes and the second compensation capacitor electrodes, which may help increase capacitance values of the compensation capacitors.

It should be noted that, in an embodiment of the present disclosure, second compensation capacitor electrodes 120 of a plurality of adjacent load compensation units may be connected to each other. In other words, the plurality of second compensation capacitor electrodes 120 of the plurality of load compensation units may be formed as a continuously extending integral structure.

Referring to FIG. 12, the first compensation capacitor electrode 110 may include a first electrode body 111, a first electrode connection portion 112, and a second electrode connection portion 113. An orthographic projection of the first electrode body 111 on the base substrate is substantially rectangular. The first electrode connection portion 112 is connected to an end of the first electrode body 111 proximate to the display area AA, and the second electrode connection portion 113 is connected to an end of the first electrode body 111 away from the display area AA.

Referring to FIG. 13, the second compensation capacitor electrode 120 may include a second electrode body 121, a third electrode connection portion 122, and a fourth electrode connection portion 123. An orthographic projection of the second electrode body 121 on the base substrate is substantially rectangular. The third electrode connection portion 122 is connected to an end of the second electrode body 121 proximate to the display area AA, and the fourth electrode connection portion 123 is connected to an end of the second electrode body 121 away from the display area AA.

Referring to FIG. 4, the display substrate further includes a plurality of first via holes VH1, for example, at least two first via holes VH1. The plurality of first via holes VH1 expose a part of the first electrode connection portion 112. A data signal line 64 is electrically connected to a first compensation capacitor electrode 110 through the plurality of first via holes VH1.

As shown in FIG. 4, the plurality of first via holes VH1 are arranged at intervals in the row direction X. That is, the plurality of first via holes VH1 that are connected to the same data signal line 64 are arranged in the row direction X. This is conducive to a full use of a space to arrange a connection structure between the compensation capacitor and the data signal line.

The display substrate further includes a plurality of second via holes VH2, for example, at least two second via holes VH2. The plurality of second via holes VH2 expose a part of the third electrode connection portion 122. A driving voltage line 65 is electrically connected to a second compensation capacitor electrode 120 through the plurality of second via holes VH2.

The plurality of second via holes VH2 are arranged at intervals in the column direction Y. That is, the plurality of second via holes VH2 that are connected to the same driving voltage line 65 are arranged in the column direction Y. This is conducive to a full use of a space to arrange a connection structure between the compensation capacitor and the driving voltage line.

With reference to FIG. 1 and FIG. 4 in combination, the test circuit 200 may include a plurality of test pins 201, which may be configured to provide a test signal. For example, the test signal may include a data signal used for the plurality of pixel units P in the display area AA.

The display substrate may further include a plurality of third via holes VH3, for example, at least two third via holes VH3. The plurality of third via holes VH3 expose a part of the second electrode connection portion 113. A test pin 201 is electrically connected to a first compensation capacitor electrode 110 through the plurality of third via holes VH3.

The plurality of third via holes VH3 are arranged at intervals in the column direction Y. That is, the plurality of third via holes VH3 that are connected to the same test pin 201 are arranged in the column direction Y.

In other words, the first compensation capacitor electrode 110 has an end electrically connected to the test pin 201 of the test circuit 200, and another end electrically connected to the data signal line 64. In this way, the compensation capacitor is electrically connected to the data signal line 64, so as to compensate a load on a data signal line 64 corresponding to a column of sub-pixels.

The display substrate further includes a plurality of fourth via holes VH4, for example, at least two fourth via holes VH4. The plurality of fourth via holes VH4 expose a part of the fourth electrode connection portion 123. The display substrate may further include a driving voltage lead wire 650 for providing the driving voltage VDD. The driving voltage lead wire 650 is electrically connected to a second compensation capacitor electrode 120 through the plurality of fourth via holes VH4. The plurality of fourth via holes VH4 are arranged at intervals in the column direction Y.

In other words, the second compensation capacitor electrode 120 has an end electrically connected to the driving voltage lead wire 650, and another end electrically connected to the driving voltage line 65.

The display substrate may further include a plurality of scanning signal lead wires 610 disposed on the base substrate 100 and located in the bezel area NA. The plurality of scanning signal lead wires 610 are configured to transmit the scanning signal output by the gate driver circuit 300 to the plurality of scanning signal lines 61 and the plurality of reset signal lines 62. For example, the plurality of scanning signal lead wires 610 may be located in the third conductive layer 23.

Referring to FIG. 3 and FIG. 4, at least one of the plurality of scanning signal lead wires 610 crosses at least one load compensation unit 1 in the row direction X.

For each row of sub-pixels, a scanning signal line 61 and a reset signal line 62 extending in the row direction X respectively provide a scanning signal and a reset signal to respective sub-pixels in the row. Correspondingly, the scanning signal lead wire 610 has an end electrically connected to the gate driver circuit 300, and another end respectively electrically connected to the scanning signal line 61 and the reset signal line 62 through a signal transfer structure. As such, the scanning signal output by the gate driver circuit 300 are transmitted to the plurality of scanning signal lines 61 and the plurality of reset signal lines 62.

At the first rounded corner portion 101 and the second rounded corner portion 102, since the load compensation units 1 are disposed between the gate driver circuit 300 and the respective rows of sub-pixels, a plurality of scanning signal lead wires 610 at the first rounded corner portion 101 and the second rounded corner portion 102 cross at least one load compensation unit 1 in the row direction X.

For example, the scanning signal lead wire 610 may cross one load compensation unit 1 in the row direction X. Optionally, the scanning signal lead wire 610 may cross two adjacent load compensation units 1 in the row direction X.

For example, an orthographic projection of at least one of the plurality of scanning signal lead wires 610 on the base substrate 100 at least partially overlaps with both orthographic projections of first compensation capacitor electrodes 110 of a plurality of compensation capacitors of the at least one load compensation unit 1 on the base substrate 100 and orthographic projections of second compensation capacitor electrodes 120 of a plurality of compensation capacitors of the at least one load compensation unit 1 on the base substrate 100.

In an embodiment of the present disclosure, a scanning signal lead wire for supplying the scanning signal is disposed above a load compensation unit to form an overlap between the scanning signal lead wire and the load compensation unit, so that the scanning signal lead wire may be compensated, and the stability of the scanning signal may be improved.

Figure 15:
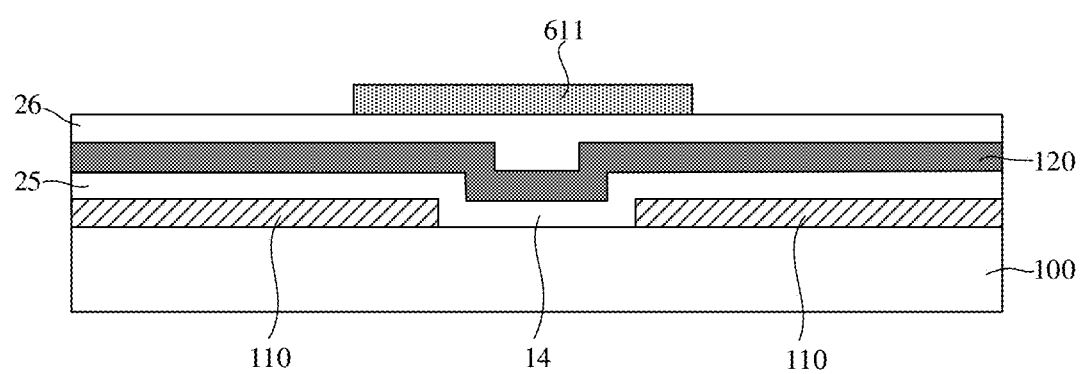
FIG. 15 shows a schematic diagram of a sectional structure of a display substrate taken along line BB' in FIG. 4, according to some exemplary embodiments of the present disclosure.

FIG. 15 shows a schematic diagram of a sectional structure of a display substrate taken along line BB' in FIG. 4, according to some exemplary embodiments of the present disclosure. Referring to FIG. 4 and FIG. 15 in combination, in the load compensation unit 1, the first compensation capacitor electrodes 110 of the plurality of compensation capacitors are arranged at intervals in the row direction X, so as to form a gap, such as the first gap 14 and the second gap 15 described above, between the plurality of first compensation capacitor electrodes 110.

At least one of the plurality of scanning signal lead wires 610 includes a first portion 611. An orthographic projection of the first portion 611 on the base substrate 100 partially overlaps with an orthographic projection of the gap on the base substrate 100. For example, the first portion 611 of the scanning signal lead wire 610 extends in a direction which is inclined with respect to each of the row direction X and the column direction Y.

For example, at least one of the plurality of scanning signal lead wires 610 includes a first portion 611 and a second portion 612. An orthographic projection of the first portion 611 on the base substrate 100 partially overlaps with an orthographic projection of the first gap 14 on the base substrate 100, and an orthographic projection of the second portion 612 on the base substrate 100 partially overlaps with an orthographic projection of the second gap 15 on the base substrate 100.

For example, at least one of the first portion 611 and the second portion 612 of the scanning signal lead wire 610 extends in a direction inclined with respect to each of the row direction X and the column direction Y. Optionally, both of the first portion 611 and the second portion 612 of the scanning signal lead wire 610 extend in the direction inclined with respect to each of the row direction X and the column direction Y. Optionally, one of the first portion 611 and the second portion 612 of the scanning signal lead wire 610 extends in the direction inclined with respect to each of the row direction X and the column direction Y, and the other one of the first portion 611 and the second portion 612 extends in the row direction X.

Continuing to refer to FIG. 4, the display substrate may further include a plurality of initialization voltage lead wires 660 disposed on the base substrate 100 and located in the bezel area NA. The plurality of initialization voltage lead wires 660 are configured to transmit the initialization voltage signal to the initialization voltage lines 66. For example, the plurality of initialization voltage lead wires 660 may be located in the third conductive layer 23.

Referring to FIG. 3 and FIG. 4, at least one of the plurality of initialization voltage lead wires 660 crosses at least one load compensation unit 1 in the row direction X.

For example, at the first rounded corner portion 101 and the second rounded corner portion 102, a plurality of initialization voltage lead wires 660 at the first rounded corner portion 101 and the second rounded corner portion 102 cross at least one load compensation unit 1 in the row direction X.

For example, the initialization voltage lead wire 660 may cross one load compensation unit 1 in the row direction X. Optionally, the initialization voltage lead wire 660 may cross two adjacent load compensation units 1 in the row direction X.

For example, an orthographic projection of at least one of the plurality of initialization voltage lead wires 660 on the base substrate 100 at least partially overlaps with orthographic projections of first compensation capacitor electrodes 110 of a plurality of compensation capacitors of at least one load compensation unit 1 on the base substrate 100 and orthographic projections of second compensation capacitor electrodes 120 of the plurality of compensation capacitors of the at least one load compensation unit 1 on the base substrate 100.

In an embodiment of the present disclosure, an initialization voltage lead wire for supplying the initialization voltage signal is disposed above a load compensation unit to form an overlap between the initialization voltage lead wire and the load compensation unit, so that the initialization voltage lead wire may be compensated, and the stability of the initialization voltage signal may be improved.

At least one of the plurality of initialization voltage lead wires 660 includes a first portion 661. An orthographic projection of the first portion 661 on the base substrate 100 partially overlaps with the orthographic projection of the gap on the base substrate 100. For example, the first portion 661 of the initialization voltage lead wire 660 extends in a direction inclined with respect to each of the row direction X and the column direction Y.

For example, at least one of the plurality of initialization voltage lead wires 660 includes a first portion 661 and a second portion 662. The orthographic projection of the first portion 661 on the base substrate 100 partially overlaps with the orthographic projection of the first gap 14 on the base substrate 100, and an orthographic projection of the second portion 662 on the base substrate 100 partially overlaps with the orthographic projection of the second gap 15 on the base substrate 100.

For example, at least one of the first portion 661 and the second portion 662 of the initialization voltage lead wire 660 extends in the direction inclined with respect to each of the row direction X and the column direction Y. Optionally, both of the first portion 661 and the second portion 662 of the initialization voltage lead wire 660 extend in the direction inclined with respect to each of the row direction X and the column direction Y. Optionally, one of the first portion 661 and the second portion 662 of the initialization voltage lead wire 660 extends in the direction inclined with respect to each of the row direction X and the column direction Y, and the other one of the first portion 661 and the second portion 662 extends in the row direction X.

Continuing to refer to FIG. 3, FIG. 4, and FIG. 12 to FIG. 14, the orthographic projection of the first compensation capacitor electrode 110 on the base substrate 100 has a first size in the column direction Y. The first size of the orthographic projection of the first compensation capacitor electrode 110 on the base substrate 100 in the column direction Y may be represented by a size of an orthographic projection of the first electrode body 111 on the base substrate 100 in the column direction Y, namely H1 in FIG. 3.

For example, a load compensation unit 1 and another adjacent load compensation unit 1 may partially overlap with each other in the column direction Y, and a size of the overlapping parts of the two adjacent load compensation units in the column direction Y may be less than or equal to half of the first size H1. For example, the size of the overlapping portion of the two adjacent load compensation units in the column direction Y may be less than or equal to half of the first size H1.

For example, a load compensation unit 1 and another adjacent load compensation unit 1 may not overlap with each other in the column direction Y. That is, the load compensation unit 1 and the other load compensation unit 1 adjacent to the load compensation unit 1 may be spaced apart in the column direction Y.

In the embodiments of the present disclosure, as described above, the reference pixel column includes N sub-pixels, and the edge pixel column includes M sub-pixels. When compensating the load on the data signal line, a value of the load required to be compensated may be determined according to a difference between the number of sub-pixels included in the edge pixel column to be compensated and the number of sub-pixels included in the reference pixel column. For the display substrate having the rounded rectangular shape as shown in FIG. 1, since the difference between the number of sub-pixels included in the edge pixel column to be compensated and the number of sub-pixels included in the reference pixel column is small, the capacitance value of the compensation capacitor may be set small. In other words, an area of the overlap between a first compensation capacitor electrode 110 and a second compensation capacitor electrode 120 in each load compensation unit 1 is proportional to the number of missing pixel units of a column of pixel units corresponding to the load compensation unit 1 (i.e., (N−M)).

In some exemplary embodiments, a capacitance value of each compensation capacitor may be less than a capacitance threshold. For example, the capacitance threshold may be about 5 fF.

Since the capacitance value of the compensation capacitor is small, a mutual influence between adjacent compensation capacitors is also small. Accordingly, a gap between adjacent compensation capacitors may be set small. For example, in an embodiment of the present disclosure, each of a size of the first gap 14 in the row direction X and a size of the second gap 15 in the row direction X may be in a range from 1 microns to 6 microns.

In addition, in an embodiment of the present disclosure, since the mutual influence between the adjacent compensation capacitors is small, the first gap 14 and the second gap 15 may not be provided with, for example, a partition member which is located in the semiconductor layer 20 and configured to isolate the adjacent compensation capacitors. That is, each of the orthographic projection of the first gap 14 on the base substrate 100 and the orthographic projection of the second gap 15 on the base substrate 100 does not overlap with an orthographic projection of the semiconductor layer 20 on the base substrate 100.

Through the above configurations, an area occupied by the load compensation unit may be reduced, which is conducive to a narrow bezel.

At least some embodiments of the present disclosure further provide a display panel including the display substrate as described above. For example, the display panel may be an OLED display panel.

Referring to FIG. 1, at least some embodiments of the present disclosure further provide a display apparatus, which may include the display substrate as described above. The display apparatus includes the display area AA and the bezel area NA, and the bezel area NA has a small width, so that a display apparatus with a narrow bezel may be achieved.

The display apparatus may include any apparatus or product with a display function. For example, the display apparatus may be a smart phone, a mobile phone, an e-book reader, a personal computer (PC), a laptop PC, a netbook PC, a personal digital assistant (PDA), a portable multimedia player (PMP), a digital audio player, a mobile medical apparatus, a camera, a wearable device (such as a head-mounted device, electronic clothing, electronic bracelet, electronic necklace, electronic accessory, electronic tattoo, or smart watch), a television, etc.

It should be understood that the display apparatus according to the embodiments of the present disclosure has all the features and advantages of the display substrate described above. Details may be referred to the above description and will not be repeated here.

Although some embodiments of a general technical concept of the present disclosure have been illustrated and described, it should be understood by those ordinary skilled in the art that these embodiments may be changed without departing from the principle and spirit of the general technical concept of the present disclosure. The scope of the present disclosure is defined by the claims and their equivalents.

What is claimed is:

1. A display substrate, comprising:
a base substrate, comprising a display area and a bezel area located on at least one side of the display area;
a plurality of pixel units located in the display area and arranged in an array along a row direction and a column direction on the base substrate, wherein each pixel unit comprises a plurality of sub-pixels;
a plurality of scanning signal lines disposed on the base substrate, wherein the plurality of scanning signal lines are configured to provide a scanning signal to a plurality of rows of sub-pixels respectively;
a gate driver circuit disposed on the base substrate and located in the bezel area, wherein the gate driver circuit is configured to output the scanning signal;
a plurality of load compensation units disposed on the base substrate and located in the bezel area, wherein the plurality of load compensation units are located between the gate driver circuit and the plurality of pixel units; and
a plurality of scanning signal lead wires disposed on the base substrate and located in the bezel area, wherein the plurality of scanning signal lead wires are configured to transmit the scanning signal output by the gate driver circuit to the plurality of scanning signal lines, respectively,
wherein at least one of the plurality of scanning signal lead wires crosses at least one of the plurality of load compensation units in the row direction;
wherein the load compensation unit comprises a plurality of compensation capacitors, wherein each compensation capacitor comprises a first compensation capacitor electrode located in a first conductive layer and a second compensation capacitor electrode located in a second conductive layer, and an orthographic projection of the first compensation capacitor electrode on the base substrate at least partially overlaps with an orthographic projection of the second compensation capacitor electrode on the base substrate,
wherein the plurality of scanning signal lead wires are located in a third conductive layer, the second conductive layer is located on a side of the first conductive layer away from the base substrate, and the third conductive layer is located on a side of the second conductive layer away from the base substrate; and
wherein an orthographic projection of at least one of the plurality of scanning signal lead wires on the base substrate partially overlaps with an orthographic projection of at least one of the plurality of load compensation units on the base.

2. The display substrate of claim 1, wherein an orthographic projection of at least one of the plurality of scanning signal lead wires on the base substrate at least partially overlaps with orthographic projections of first compensation capacitor electrodes of a plurality of compensation capacitors of at least one of the plurality of load compensation units on the base substrate and with orthographic projections of second compensation capacitor electrodes of the plurality of compensation capacitors of the at least one of the plurality of load compensation units on the base substrate.

3. The display substrate of claim 2, wherein the plurality of load compensation units correspond to a plurality of columns of pixel units one by one, and an area of an overlapping region between the first compensation capacitor electrode and the second compensation capacitor electrode in each load compensation unit is proportional to a number of pixel units which are lacked in the column of pixel units corresponding to the load compensation unit.

4. The display substrate of claim 1, wherein, within one load compensation unit, first compensation capacitor electrodes of the plurality of compensation capacitors are arranged at intervals in the row direction, so as to form a gap between the plurality of first compensation capacitor electrodes; and
wherein at least one of the plurality of scanning signal lead wires comprises a first portion, and an orthographic projection of the first portion of the scanning signal lead wire on the base substrate partially overlaps with an orthographic projection of the gap on the base substrate.

5. The display substrate of claim 4, wherein the first portion of the scanning signal lead wire extends in a direction inclined with respect to each of the row direction and the column direction.

6. The display substrate of claim 4, further comprising:
a plurality of initialization voltage lines disposed on the base substrate, wherein the plurality of initialization voltage lines are configured to provide an initialization voltage signal to the plurality of rows of sub-pixels, respectively; and
a plurality of initialization voltage lead wires disposed on the base substrate and located in the bezel area, wherein the plurality of initialization voltage lead wires are configured to transmit the initialization voltage signal to the plurality of initialization voltage lines,
wherein at least one of the plurality of initialization voltage lead wires crosses at least one of the plurality of load compensation units in the row direction.

7. The display substrate of claim 6, wherein at least one of the plurality of initialization voltage lead wires comprises a first portion, and an orthographic projection of the first portion of the initialization voltage lead wire on the base substrate partially overlaps with the orthographic projection of the gap on the base substrate; and
wherein the first portion of the initialization voltage lead wire extends in a direction inclined with respect to each of the row direction and the column direction.

8. The display substrate of claim 6, wherein the plurality of scanning signal lines are located in the first conductive layer; and/or
the plurality of initialization voltage lines are located in the second conductive layer.

9. The display substrate of claim 1, further comprising a plurality of data signal lines disposed on the base substrate and configured to provide a data signal to a plurality of columns of sub-pixels, respectively,
wherein each first compensation capacitor electrode is electrically connected to one of the plurality of data signal lines through at least two first via holes,
wherein the at least two first via holes are arranged at intervals in the row direction.

10. The display substrate of claim 9, further comprising a plurality of driving voltage lines disposed on the base substrate, and configured to provide a driving voltage signal to the plurality of columns of sub-pixels respectively;

wherein each second compensation capacitor electrode is electrically connected to one of the plurality of driving voltage lines through at least two second via holes, wherein the at least two second via holes are arranged at intervals in the column direction;

wherein the display substrate further comprises a driving voltage lead wire disposed on the base substrate and located in the bezel area, wherein the driving voltage lead wire is configured to transmit the driving voltage signal; and wherein each second compensation capacitor electrode is electrically connected to the driving voltage lead wire through at least two fourth via holes.

11. The display substrate of claim 9, further comprising a test circuit disposed on the base substrate and located in the bezel area, wherein the test circuit is configured to output a data signal; and wherein each first compensation capacitor electrode is electrically connected to the test circuit through at least two third via holes.

12. The display substrate of claim 1, wherein an orthographic projection of one first compensation capacitor electrode on the base substrate has a first size in the column direction; and one load compensation unit partially overlap with another load compensation unit adjacent to the load compensation unit in the column direction, wherein a size of an overlapping part between two adjacent load compensation units in the column direction is less than or equal to half of the first size; or wherein one load compensation unit and another load compensation unit adjacent to the load compensation unit are spaced apart in the column direction.

13. The display substrate of claim 1, wherein the load compensation unit comprises at least three compensation capacitors, and within one load compensation unit, first compensation capacitor electrodes of the at least three compensation capacitors are arranged at intervals in the row direction, so as to form a first gap and a second gap between the at least three first compensation capacitor electrodes; and wherein the at least one of the plurality of scanning signal lead wires comprises a first portion and a second portion, wherein an orthographic projection of the first portion of the scanning signal lead wire on the base substrate partially overlaps with an orthographic projection of the first gap on the base substrate, and an orthographic projection of the second portion on the base substrate partially overlaps with an orthographic projection of the second gap on the base substrate.

14. The display substrate of claim 13, wherein at least one of the first portion and the second portion of the scanning signal lead wire extends in a direction inclined with respect to each of the row direction and the column direction.

15. The display substrate of claim 13, wherein at least one of the plurality of initialization voltage lead wires comprises a first portion and a second portion, an orthographic projection of the first portion of the initialization voltage lead wire on the base substrate partially overlaps with the orthographic projection of the first gap on the base substrate, and an orthographic projection of the second portion of the initialization voltage lead wire on the base substrate partially overlaps with the orthographic projection of the second gap on the base substrate, wherein at least one of the first portion and the second portion of the initialization voltage lead wire extends in a direction inclined with respect to each of the row direction and the column direction.

16. The display substrate of claim 15, wherein, within one load compensation unit, second compensation capacitor electrodes of the plurality of compensation capacitors are connected to each other;

wherein, within one load compensation unit, orthographic projections of first compensation capacitor electrodes of the plurality of compensation capacitors on the base substrate falls within an orthographic projection of the plurality of second compensation capacitor electrodes that are connected to each other on the base substrate;

wherein the orthographic projection of the plurality of second compensation capacitor electrodes that are connected to each other on the base substrate covers each of the orthographic projection of the first gap on the base substrate and the orthographic projection of the second gap on the base substrate;

wherein the orthographic projection of the plurality of second compensation capacitor electrodes that are connected to each other on the base substrate covers each of the orthographic projection of the first portion of the scanning signal lead wire on the base substrate and the orthographic projection of the second portion of the scanning signal lead wire on the base substrate; and wherein the orthographic projection of the plurality of second compensation capacitor electrodes that are connected to each other on the base substrate covers each of the orthographic projection of the first portion of the initialization voltage lead wire on the base substrate and the orthographic projection of the second portion of the initialization voltage lead wire on the base substrate.

17. The display substrate of claim 13, wherein each of a size of the first gap in the row direction and a size of the second gap in the row direction is in a range from 1 microns to 6 microns.

18. The display substrate of claim 1, wherein an orthographic projection of the display area on the base substrate has a shape of a rounded rectangle, wherein the plurality of load compensation units are arranged along an outline of a rounded corner of the rounded rectangle.

19. A display apparatus comprising the display substrate of claim 1.

* * * * *